(12) United States Patent
Okuyama et al.

(10) Patent No.: US 7,002,183 B2
(45) Date of Patent: Feb. 21, 2006

(54) SEMICONDUCTOR LIGHT EMITTING DEVICE HAVING A SEMICONDUCTOR LAYER FORMED BY SELECTIVE GROWTH

(75) Inventors: Hiroyuki Okuyama, Kanagawa (JP); Masato Doi, Kanagawa (JP); Goshi Biwa, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/077,452

(22) Filed: Mar. 9, 2005

(65) Prior Publication Data

US 2005/0161661 A1 Jul. 28, 2005

Related U.S. Application Data

(63) Continuation of application No. 10/091,954, filed on Mar. 5, 2002, now Pat. No. 6,881,982.

(30) Foreign Application Priority Data

Mar. 6, 2001 (JP) ............................ P2001-061837

(51) Int. Cl.
    *H01L 33/00* (2006.01)

(52) U.S. Cl. ............................ 257/91; 257/88; 257/95; 257/98; 257/99; 257/103

(58) Field of Classification Search ................ 257/103, 257/99, 98, 95, 91, 88
See application file for complete search history.

(56) References Cited

U.S. PATENT DOCUMENTS 6,881,982 B1 * 4/2005 Okuyama et al. ............. 257/91
2005/0161681 A1 * 7/2005 Okuyama et al. ............. 257/79

* cited by examiner

*Primary Examiner*—Minhloan Tran
*Assistant Examiner*—Tan Tran
(74) *Attorney, Agent, or Firm*—Bell, Boyd & Lloyd LLC

(57) ABSTRACT

Semiconductor light emitting devices are provided. The semiconductor light emitting device includes a base body, a selection mask having a stripe-shaped opening portion, the selection mask being formed on the base body, a semiconductor layer formed by selective growth from the opening portion in such a manner as to have a ridge line substantially parallel to long-sides of the opening portion, and a first conductive type cladding layer, an active layer, and a second conductive type cladding layer, which are formed on the semiconductor layer.

1 Claim, 20 Drawing Sheets

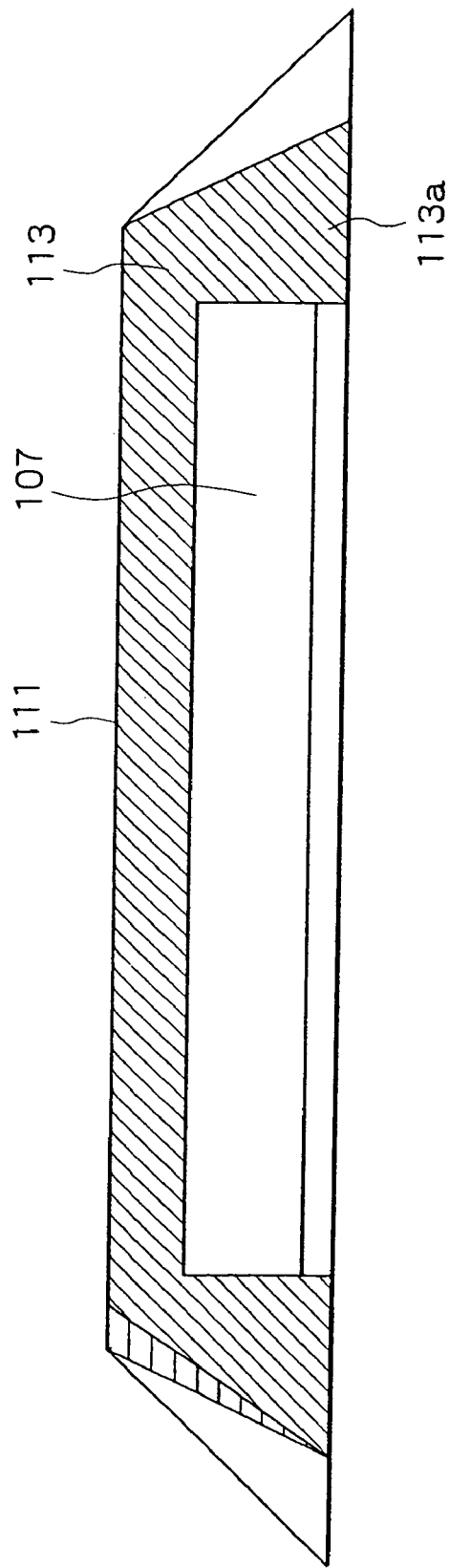

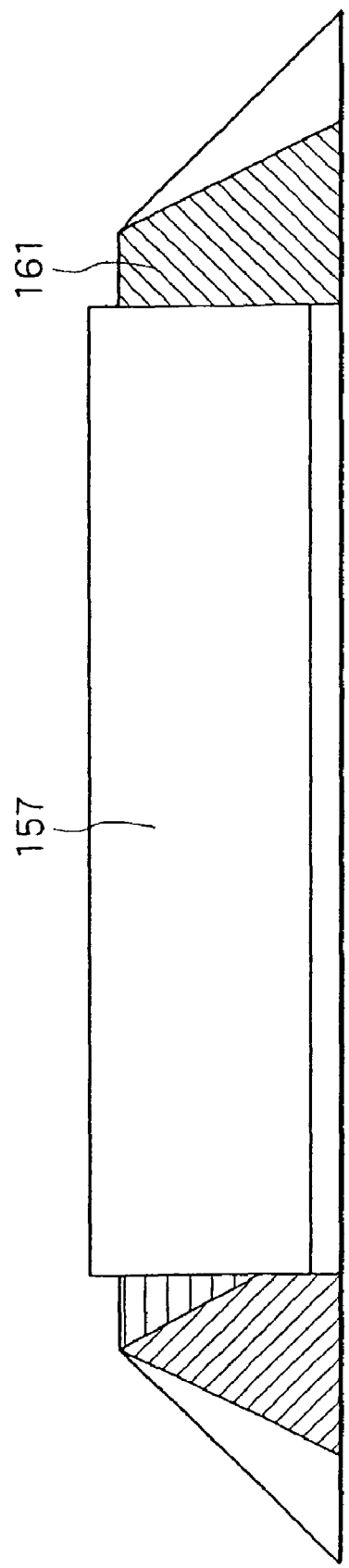

SEMICONDUCTOR LIGHT EMITTING DEVICE HAVING A SEMICONDUCTOR LAYER FORMED BY SELECTIVE GROWTH

CROSS REFERENCE TO RELATED APPLICATIONS

The present application is a continuation of U.S. patent application Ser. No. 10/091,954 filed on Mar. 5, 2002 now U.S. Pat. 6,881,982, the disclosure of which is herein incorporated by reference.

BACKGROUND OF THE INVENTION

The present invention relates to semiconductor light emitting devices and processes for producing same. More particularly, the present invention relates to a semiconductor light emitting device, a display unit, a method of fabricating a semiconductor light emitting device, and a method of fabricating a semiconductor laser having wurtzite type compound semiconductor layers such as GaN based semiconductor layers that are formed by selective growth.

Conventionally, when manufacturing a semiconductor light emitting device, a semiconductor laser device or a light emitting diode is fabricated by forming a selection mask on a sapphire substrate and selectively growing a semiconductor layer made from a nitride such as gallium nitride through an opening in the selection mask. Sapphire is often used as a substrate for growing gallium nitride. However, dislocations often occur in the crystals, at a high density, due to mismatches between the crystal lattices of the sapphire substrate and gallium nitride. The following methods are known to reduce crystal defects: a method of forming a low temperature buffer layer on a substrate; a method of combining usual crystal growth with selective crystal growth in the lateral direction (ELO: Epitaxial Lateral Overgrowth as described in Japanese Patent Laid-open No. Hei 10-312971); and a method of forming a gallium nitride based semiconductor laser, in which stacked layers having tilt planes are formed by selective growth (see Japanese Patent Laid-open No. Hei 11-312840).

Conventionally, an image display unit is configured by arranging pixels in a matrix. Each pixel is composed of a combination of light emitting diodes or semiconductor lasers of blue, green and red. An image is displayed by independently driving the respective pixels. The image display unit can be also used as a white light emitting unit or an illumination unit by allowing the light emitting devices of blue, green, and red to simultaneously emit light of blue, green, and red. In particular, since a light emitting device using a nitride based semiconductor has a band gap energy ranging from about 1.9 eV to about 6.2 eV, a number of light emitting devices capable of emitting light of many colors can be fabricated using only semiconductor layers made from one kind of material (i.e., the nitride based semiconductor), thereby easily realizing a full-color display. Multicolor light emitting devices using nitride based semiconductors have been studied extensively. It is to be noted that the term "nitride" used herein describes a compound which contains one or more of B, Al, Ga, In, and Ta as group III elements and N as a group V element, and which may contain impurities in an amount of about 1% or less of the total amount or about $1 \times 10^{20}$ cm$^3$ or less.

In the above-described method, which makes use of selective crystal growth in the lateral direction for reducing through-dislocations from a substrate, and in the crystal growth method, in which a facet structure is formed in a growth region for reducing through-dislocations from a substrate, it is possible to bend through-dislocations from a substrate in the lateral direction by the facet structure portion or the like, and hence to significantly reduce crystal defects. However, to form a light emission region including an active layer after selective crystal growth in the lateral direction or formation of the facet structure, the selective crystal growth in the lateral direction must be further continued or the facet structure is buried in order to obtain a flat plane on which the light emission region is to be formed. As a result, the number of processing steps is increased and the time required for fabricating the device is prolonged.

The above-described gallium nitride based semiconductor laser and its fabrication method are disclosed in Japanese Patent Laid-open No. Hei 11-312840. When manufacturing a device according to this method, a conductive selection mask is formed in an approximately center portion of an opening portion of an insulating selection mask, to obtain a stacked structure having a triangular shape in cross-section formed by selective growth. In such a semiconductor laser, however, the stacked structure having the triangular shape in cross-section is only used as a high resistance region for concentrating a current at an active layer located at the center portion. Therefore, even though a (1-101) plane (which is called an S-plane) appearing on a tilt or a slant plane is excellent for repeatability of fabrication, a region as the active layer is limited to the vicinity of the conductive selection mask at the central portion held by the stacked structure having the triangular shape in cross-section. Accordingly, it is difficult to control a film quality of the active layer. As a result, the repeatability of the fabrication of the whole device is degraded.

SUMMARY OF THE INVENTION

An object of the present invention is, therefore, to provide a semiconductor light emitting device, a display unit, a method of fabricating a semiconductor light emitting device, and a method of fabricating a semiconductor laser, which reduce crystal defects, such as through-dislocations, without increasing the number of fabrication steps and enhance repeatability of fabrication.

According to an embodiment of the present invention, a semiconductor light emitting device is provided. The device includes a base body and a selection mask formed on the base body. The selection mask defines a stripe-shaped opening portion having long-sides. A semiconductor layer is formed by selective growth from the opening portion such to have a ridge line substantially parallel to the long-sides of the opening portion. Further, a first conductive type cladding layer, an active layer, and a second conductive type cladding layer, are formed on the semiconductor layer.

According to the above-described semiconductor light emitting device, the selection mask having the stripe-shaped opening portion is formed and the semiconductor layer having a ridge line is formed by selective growth from the opening portion. As a result, tilted crystal planes extending from the ridge line to the selection mask are formed, and the first conductive type cladding layer, the active layer, and the second conductive type cladding layer are formed on the semiconductor layer having the tilted crystal planes, to obtain a light emitting structure. In the semiconductor layer having the ridge line, crystallinity is relatively stable in the direction extending along the ridge line, and it is possible to suppress a variation in characteristics of the light emitting device. Since an electrode is formed on the second conductive type cladding layer, with its position limited to a region having desirable crystallinity, it is possible to suppress a variation between one and another of the devices.

According to another embodiment of the present invention, a semiconductor light emitting device is provided. The device includes a base body and a selection mask formed on the base body. The selection mask defines a stripe-shaped opening portion extending with its longitudinal direction taken as a (1-100) direction or a (11-20) direction or a direction tilted from a (1-100) direction or a (11-20) direction by an angle ranging from about 0.2° to about 20°. A semiconductor layer is formed by selective growth from the opening portion such as to have a ridge line substantially parallel to the longitudinal direction of the opening portion. A first conductive type cladding layer, an active layer, and a second conductive type cladding layer, are formed on the semiconductor layer.

According to the above-described semiconductor light emitting device, since the longitudinal direction of the stripe-shaped opening portion of the selective growth mask is taken as the (11-20) direction or the (1-100) direction, it is possible to easily form the semiconductor layer having the ridge line substantially parallel to the longitudinal direction of the opening portion. Also, since the longitudinal direction of the stripe-shaped opening portion of the selective growth mask is alternatively taken as the direction tilted from the (11-20) direction or the (1-100) direction by an angle ranging from about 0.2° to about 20°, it is possible to easily form the semiconductor layer having the ridge line substantially parallel to the longitudinal direction of the opening portion. In the latter case, that is, in the case where the longitudinal direction of the opening portion is tilted from the (11-20) direction or the (1-100) direction by a specific angle, crystal steps tend to be made regular in the whole of a crystal plane. Accordingly, it is possible to significantly reduce a variation between one and another of the devices by forming an electrode in the region in which the regular crystal steps are formed.

In further embodiments of the present invention, a display unit can be fabricated by arranging a number of semiconductor light emitting devices described in each of the previous embodiments of the present invention, and a semiconductor laser device can be fabricated by forming resonance planes onto the display unit by cleavage or the like.

Additional features and advantages of the present invention are described in, and will be apparent from, the following Detailed Description of the Invention and the figures.

BRIEF DESCRIPTION OF THE FIGURES

FIG. 13 is a side view of a portion of the semiconductor light emitting device according to the seventh embodiment, showing one of the tilt planes of the semiconductor layers and an electrode formed thereon.

FIGS. 16A and 16B are views illustrating steps of fabricating a semiconductor laser device according to a tenth embodiment of the present invention, wherein FIG. 16A is a plan view showing a device state after formation of electrodes, and FIG. 16B is a sectional view taken on line b—b of FIG. 16A.

FIG. 17 is a sectional view showing a portion of the semiconductor laser device shown in FIGS. 16A and 16B, illustrating the method of fabricating a semiconductor laser device according to the tenth embodiment.

FIGS. 18A and 18B are views illustrating steps of fabricating a semiconductor laser device according to the tenth embodiment, wherein FIG. 18A is a plan view showing a device state after cleavage, and FIG. 18B is a sectional view taken on line b—b of FIG. 18A.

DETAILED DESCRIPTION OF THE INVENTION

Figure 1A:
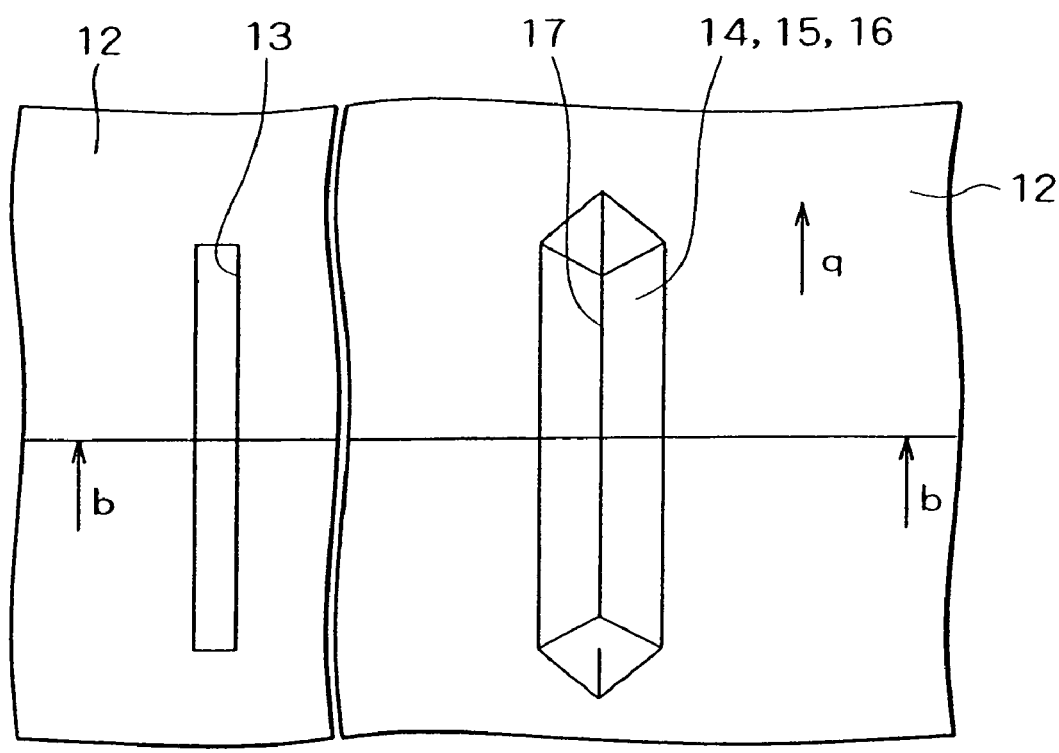
FIG. 1A is a plan view of a semiconductor light emitting device according to a first embodiment of the present invention, showing a state of the device before and after selective growth from an opening of a selection mask which is formed in such a manner as to extend in a (1-100) direction or a (11-20) direction.

A semiconductor light emitting device according to an embodiment of the present invention is manufactured by forming a selection mask having a stripe-shaped opening portion on a base body, forming a semiconductor layer having a ridge line parallel to long-sides of the stripe-shaped opening portion by selective growth from the opening portion of the selection mask, and stacking a first conductive type cladding layer, an active layer, and a second conductive layer on the semiconductor layer.

The base body used for a semiconductor light emitting device according to an embodiment of the present invention is not particularly limited insofar as a wurtzite type compound semiconductor layer can be formed thereon. For example, a substrate made from sapphire ($Al_2O_3$, whose desirable crystal plane is an A-plane, R-plane, or C-plane), SiC (having a structure of 6H, 4H or 3C), GaN, Si, ZnS, ZnO, AlN, LiMgO, $LiGaO_2$, GaAs, $MgAl_2O_4$, or InAlGaN can be used as the base body. Preferably, the material used for forming the base body has a hexagonal or cubic system, and more preferably, has the hexagonal system. When using a sapphire substrate, preferably a sapphire substrate with the C-plane of sapphire taken as a principal plane thereof, which has been often used for growing a gallium nitride (GaN) based compound semiconductor thereon, is used. It is to be noted that the C-plane of sapphire taken as the principal plane of the substrate in the present invention may be tilted from the strict C-plane by an angle ranging from about 5° to about 6°. A silicon substrate, which has been widely used for fabricating semiconductor devices, may be also used as the base body.

It is noted that the plane terminology (e.g., S-plane, C-plane or the like) as used herein denotes crystal planes in accordance with Miller indices of a hexagonal crystal system. Where appropriate, throughout the specification, these planes are intended to include more than one plane in the hexagonal crystal system. For example, the S-plane is listed above as corresponding to the (1-101) plane, but it should be understood that, where appropriate, the S-plane is intended to include one or more of the planes relating to the family of planes making up a crystal structure having the S-plane. For example, if the crystal structure being described is a hexagonal pyramid having the S-plane, planes corresponding to each side face of the hexagonal pyramid would be included in the family of planes denoted by the S-plane. For example, in addition to the (1-101) plane, a hexagonal pyramid has side faces corresponding to the (10-11), (01-11), (-1101) and (0-111) planes.

The base body, used as an under layer on which a selection mask for selective growth is to be formed, may be the above-described substrate itself. However, to obtain good crystallinity at the time of selective growth, the base body according to an embodiment of the present invention may be of a two-layer structure having the substrate and an under growth layer such as a buffer layer formed on the base body. The under growth layer may be a compound semiconductor layer, which is preferably made from a compound semiconductor having a wurtzite type crystal structure such that a facet structure will be formed thereon in the subsequent step. Specifically, the compound semiconductor layer may be made from a nitride semiconductor having a wurtzite type crystal structure, a BeMgZnCdS based semiconductor, a BeMgZnCdO based compound semiconductor, or the like. As the nitride semiconductor having a wurtzite type crystal structure, there may be used a group III based compound semiconductor, for example, a gallium nitride (GaN) based compound semiconductor, an aluminum nitride (AlN) based compound semiconductor, an indium nitride (InN) based compound semiconductor, an indium gallium nitride (InGaN) based compound semiconductor, an aluminum gallium nitride (AlGaN) based compound semiconductor, or the like. Preferably, a gallium nitride based compound semiconductor is used. In an embodiment, an undoped GaN layer may be formed on a sapphire substrate and a Si-doped GaN layer may be formed thereon. It is to be noted that, in an embodiment of the present invention, InGaN, AlGaN, GaN or the like does not necessarily mean a nitride semiconductor having only a ternary or binary mixed crystal structure. For example, InGaN can contain an impurity such as a trace of Al in a range not changing the function of InGaN without departing from the scope of the present invention. In this specification, the term "nitride" describes a compound which contains one or more of B, Al, Ga, In, and Ta as the group III elements and N as the group V element, and which may contain impurities in an amount of about 1% of the total amount or less, or about $1 \times 10° cm^3$ or less.

In an embodiment, the above-described compound semiconductor layer may be grown by one of various vapor phase growth processes, for example, a metal organic chemical vapor deposition (MOCVD) (including a metal organic vapor phase epitaxial (MOVPE) growth process), a molecular beam epitaxial growth (MOB) process, a hydride vapor phase epitaxial growth (HVPE) process, and the like. The MOVPE process is advantageous in growing the compound semiconductor layer with good crystallinity at a high processing rate. In the MOVPE process, alkyl metal compounds are typically used as Ga, Al and In sources. Preferably, TMG (trimethyl gallium) or TEG (triethyl gallium) is used as the Ga source, TMA (trimethyl aluminum) or TEA (triethyl aluminum) is used as the Al source, and TMI (trimethyl indium) or TEI (triethyl indium) is used as the In source. Further, in the MOVPE process, a gas such as ammonia, hydradine, or the like may be used as a nitrogen source while silane gas or the like may be used as an Si (impurity) source. Also, germane gas or the like may be used as a Ge (impurity) source, Cp2Mg (cyclopentadienyl magnesium) or the like may be used as a Mg (impurity) source, and a DEZ (diethyl zinc) gas or the like may be used as a Zn (impurity) source. According to the MOVPE process, for example, an InAlGaN based compound semiconductor layer can be formed on a substrate by epitaxial growth by supplying the above gases to a front surface of the substrate heated, for example, at 600° C. or more, to decompose the gases.

According to an embodiment of the semiconductor light emitting device of the present invention, a selection mask having a stripe-shaped opening portion is formed on a surface of the above-described compound semiconductor layer taken as the under growth layer for crystal growth, and a semiconductor layer having a ridge line parallel to long-sides of the stripe-shaped opening portion of the selection mask is formed by selective growth from the opening portion of the selection mask.

In an embodiment, the mask is a growth obstruction layer, which is formed on a buffer layer as the under growth layer or another layer formed on the substrate (or may be directly formed on the principal plane of the substrate). Preferably, the mask is formed of an insulating film such as a silicon oxide film or a silicon nitride film. The mask is formed into a stripe-shape. A shape of each of end portions on short-sides of the mask may be a linear shape, a circular-arc shape, or a polygonal shape such as a triangular, pentagonal, or hexagonal shape.

After formation of the mask for selective growth, a semiconductor layer having a ridge line parallel to long-sides of the stripe-shaped opening portion of the mask is formed by selective growth from the stripe-shaped opening portion of the mask. The crystal growth may be performed in accordance with the same manner as that for forming the above-described compound semiconductor layer. For example, one of the various vapor phase growth processes (e.g., MOCVD, MOVPE, MOB, HVPE, or the like) may be used.

According to an embodiment of the semiconductor light emitting device of the present invention, a semiconductor layer having a ridge line parallel to long-sides of the opening portion of the mask is formed by selective growth from the opening portion of the mask. Each of a pair of crystal planes of the semiconductor layer, which are located on both sides of the ridge line, is preferably selected from a (1-101) plane (which is called an S-plane), a (11-22) plane, and planes substantially equivalent. thereto. A plane substantially equivalent to the S-plane or the (11-22) plane includes a plane tilted from the S-plane or the (11-22) plane by an angle ranging from about 5° to about 6°. The pair of crystal planes are planes tilted downwardly from the ridge line. For example, if the C$^+$-plane is taken as the substrate principal plane, it is possible to easily form the S-plane or a plane equivalent thereto, or the (11-22) plane or a plane substantially equivalent thereto. When performing selective growth, the S-plane or the (11-22) plane as the tilt plane tilted from the principal plane of the base body is a stable plane which is relatively easily, selectively grown on the C$^+$-plane. The C$^+$-plane and C$^-$-plane are present as the C-plane, and similarly, the S$^+$-plane and S$^-$-plane are present as the S-plane. In this specification, unless otherwise specified, the S$^+$-plane, which is grown on the C$^+$-plane of a GaN layer, is taken as the S-plane. The S$^+$-plane is more stable than the S$^-$-plane. It is to be noted that the C$^+$-plane is expressed by a (0001) plane in Miller indices of a hexagonal crystal system.

When forming a crystal layer by growing a gallium nitride based compound semiconductor, the number of bonds of gallium (Ga), which are to be bonded to nitrogen (N), on the S-plane is two or three. The number of bands of Ga to N on the S-plane is smaller than the number of bonds of Ga to N on the C$^-$-plane but is larger than the number of bonds of Ga to N on any other crystal plane. Here, since the C$^-$-plane cannot be actually formed on the C$^+$-plane, the number of bonds of Ga to N on the S-plane becomes the largest. For example, in the case of growing a wurtzite type nitride on a sapphire substrate with the C$^+$-plane taken as the principal plane, a surface of the nitride generally becomes the C$^+$-plane. However, the S-plane of the nitride can be stably formed by making use of selective growth. Nitrogen (N) is likely to be desorbed on a plane parallel to the C$^+$-plane, and specifically, N is bonded to Ga by way of only one bond of Ga on the plane parallel to the C$^+$-plane. On the other hand, on the S-plane tilted from the C$^+$-plane, N is bonded to Ga via at least one or more bonds of Ga. As a result, a V/III ratio of the stacked structure selectively grown on the S-plane is effectively increased to improve the crystallinity of the stacked structure selectively grown on the S-plane. Further, since a crystal growth layer is formed along a direction different from the orientation of the principal plane of a substrate, dislocations propagated upwardly from the substrate are deflected. As a result, it is possible to reduce the occurrence of crystal defects.

Where the longitudinal direction of the stripe-shaped opening portion of the mask for selective growth is taken as the (11-20) direction or the (1-100) direction, it is possible to easily form a semiconductor layer having a ridge line extending in the longitudinal direction of the opening portion. The stripe-shaped opening portion extending with its longitudinal direction tilted from the (11-20) direction or the (1-100) direction by an angle ranging from about 0.2° to about 20° can be used for selective growth. Where the longitudinal direction of the opening portion is tilted from the (11-20) direction or the (1-100) direction by a specific angle, crystal steps tend to be made regular in the whole of a crystal plane, so that it is possible to significantly reduce a variation between one and another of devices by forming an electrode in the region in which regular crystal steps are formed. When using an opening portion extending in the direction tilted from the (11-20) direction or the (1-100) direction by an angle of less than about 0.2°, crystallinity of the semiconductor layer formed by selective growth from such an opening portion is substantially the same as that of the semiconductor layer formed by selective growth from an opening portion extending in the (11-20) direction or the (1-100) direction. On the other hand, when using the opening extending in a direction tilted from the (11-20) direction or the (1-100) direction by an angle larger than about 20°, other crystal steps may appear on the crystal plane.

A first conductive type cladding layer, an active layer, and a second conductive type cladding layer are stacked on the above semiconductor layer such as to be located on tilt planes formed on both sides of the ridge line. Upon observing a facet structure of a nitride semiconductor layer, which is formed by selective growth, using cathode luminescence in an experiment performed by the present inventors, it was revealed that the S-plane as a tilt plane of the facet structure has desirable crystallinity and exhibits a higher luminous efficiency when compared with the C$^+$-plane. In particular, a growth temperature for growing an InGaN layer ranges from of 700 to 800° C. At this temperature, the decomposition efficiency of ammonia is low. Thus, a large amount of an N source is required. As a result of observing the surface of the tilt plane (S-plane) by AFM, it was found that the tilt plane has regular crystal steps and is suitable for incorporation of InGaN. In general, the state of a growth surface of a Mg-doped layer at the AFM level is poor. However, the observation by AFM showed that the growth of the S-plane allows the Mg-doped layer to be grown in a desirable surface state and makes a doping condition for the Mg-doped layer very different from a doping condition for the Mg-doped layer on the C⁺-plane. When using microscopic photoluminescence mapping it was revealed that the surface of the Mg-doped layer formed on the C⁺-plane by the usual manner has an unevenness of a pitch of about 1 m. However, when examining the surface of the Mg-doped layer formed on the S-plane obtained by selective growth, it was found to be even and measured at a resolution of about 0.5 m to about 1 m. Further, as a result of observation by SEM, it was revealed that the flatness of the tilt plane (i.e., the S-plane) is superior to that of the C⁺-plane.

With respect to the first conductive type cladding layer, the active layer, and the second conductive type cladding layer, which are stacked on the tilt plane, the conductive type of the first conductive type cladding layer is a p-type or an n-type, and the conductive type of the second conductive type cladding layer is the n-type or the p-type. For example, in the case where a crystal layer having the S-plane is made from a silicon-doped gallium nitride based compound semiconductor, the n-type cladding layer may be composed of the same silicon-doped gallium nitride based compound semiconductor, an InGaN layer may be formed as an active layer thereon, and a magnesium-doped gallium nitride based compound semiconductor layer may be formed as a p-type cladding layer thereon. Thus, a double hetero structure is formed. The active layer may have a structure in which an InGaN layer is held between AlGaN layers or an AlGaN layer is provided on one side of the InGan layer. The active layer may be a single bulk active layer. However, it may be of a quantum well structure such as a single quantum well (SQW) structure, a double quantum well (DQW) structure, or a multi-quantum well (MQW) structure. When adopting the quantum well structure, one or more barrier layers are used for separating quantum wells from each other. The use of the InGaN layer as the active layer is advantageous in facilitating the fabricating process and enhancing a light emission characteristic of the device. Another advantage of the use of the InGaN layer is that the InGaN layer can be easily crystallized on the S-plane, which has the structure from which nitrogen atoms are less desorbed, to improve the crystallinity, thereby enhancing the luminous efficiency. In addition, even in a state that a nitride semiconductor is not doped with an impurity, the conductive type of the nitride semiconductor becomes the n-type because of nitrogen holes generated in crystal. However, in general, an n-type nitride semiconductor having a desirable carrier concentration is obtained by doping a doner impurity such as Si, Ge, or Se in crystal. On the other hand, a p-type nitride semiconductor is obtained by doping an acceptor impurity such as Mg, Zn, C, Be, Ca, or Ba in crystal. In this case, to obtain a p-type nitride semiconductor having a high carrier concentration, the nitride semiconductor having been doped with an acceptor impurity may be annealed in an inert gas atmosphere such as nitrogen or argon at a temperature or 400° C. or more, or activated by irradiation of electron beams, microwaves, or light.

The first conductive type cladding layer, the active layer, and the second conductive type cladding layer extend within planes parallel to tilt planes. The formation of these layers within the planes parallel to the tilt planes can be easily performed by continuing crystal growth on the tilt planes after formation of the tilt planes. The first conductive type cladding layer can be made from the same material having the same conductive type as that for a crystal layer having the S-planes. After the crystal layer having the S-planes is formed, the first conductive type cladding layer may be formed by depositing the same material while continuously adjusting a concentration. Alternatively, the first conductive type cladding layer may be configured as part of the crystal layer having the S-planes.

Electrodes are directly or indirectly connected to the first and second conductive type cladding layers with an active layer put therebetween. Each type of electrode is formed for each device. However, one of a p-type electrode and an n-type electrode is made common to a number of devices. To reduce a contact resistance, a specific contact layer may be formed and then an electrode be formed on the contact layer. In general, each electrode is obtained by forming a multi-layer metal film by vapor-deposition, and finely patterning the multi-layer metal film for each device by lithography and lift-off. Each electrode can be formed on one side of a selective crystal growth layer or a substrate. Alternatively, electrodes may be formed on both sides of a selective crystal growth layer or a substrate to be wired at a higher density. Electrodes independently driven can be formed by a finely processed pattern of the same material. Electrodes for respective regions may be made from different electrode materials.

In particular, according to an embodiment of the present invention, an electrode can be selectively formed in only a region having a desirable crystal structure. For example, if a crystal plane has a region in which irregular crystal steps are formed, an electrode can be formed in a region excluding such a region having the irregular crystal steps. The presence of a region having irregular crystal step can be confirmed by observation using AFM or on the basis of experience. As one example, an electrode can be formed in a region excluding a portion on a ridge line or a region near each end portion.

According to an embodiment of the semiconductor light emitting device of the present invention, a luminous efficiency can be enhanced by making use of desirable crystallinity of tilt planes formed on both sides of a ridge line of a semiconductor layer formed by selective growth. In particular, in the case of injecting a current only in an S-plane, having good crystallinity, of a group III nitride based semiconductor layer, since the S-plane is excellent in incorporation of In and crystallinity is excellent, it is possible to enhance the luminous efficiency. In particular, to fabricate a multi-color light emitting device by using an InGaN layer, indium (In) is required to be sufficiently incorporated as crystal. From this viewpoint, the luminous efficiency of the device can be enhanced by making use of good incorporation of In and good crystallinity of the S-plane and the structure is desirable for emission of light of multi-colors. In the case of crystal growth on the C⁺-plane, gallium has only one bond to nitrogen liable to be desorbed. As a result, when crystal growth is performed by using ammonia whose decomposition efficiency is low, it is impossible to increase an effective V/III ratio, thereby failing to obtain good crystal growth. Meanwhile, in the case of crystal growth on the S-plane, since the number of bonds of gallium to nitrogen on the S-plane is as large as two or three, the desorption of nitrogen becomes small and thereby the effective V/III ratio becomes high. In general, the quality of crystal grown on not only the S-plane but also on any other plane than the C⁺-plane becomes high because the number of bonds of gallium to nitrogen tends to be increased for growth on any other crystal growth than the C⁺-plane. The growth of crystal on the S-plane is also advantageous in that the amount of In incorporated in the crystal grown on the S-plane becomes high. The increased amount of In incorporated in crystal grown on the S-plane is effective for fabricating a multicolor light emitting device because a band gap energy is determined on the base of the amount of In incorporated in the crystal.

In one embodiment of the semiconductor light emitting device of the present invention, device structure is provided, the periphery of which has tilt planes formed by selective growth. One conductive layer is formed in self-alignment on planes formed on the tilt planes. That is to say, since the periphery of the device has the tilt planes, the conductive layer is formed into a shape tilted from a substrate principal plane. In this case, an end portion of the conductive layer is terminated at a mask used for selective growth. As a result, conductive layers for individual devices are formed in such a manner as to be aligned only to tilt planes of each device. For example, in a device structure having a first conductive type cladding layer, an active layer, and a second conductive type cladding layer stacked in this order from a base body side, the second conductive type cladding layer forms the above-described conductive layer formed in self-alignment. As a result, the conductive layers are not required to be separated from each other by etching. Thus, the devices can be arranged at a high density.

The semiconductor light emitting device according to an embodiment of the present invention is typically exemplified by a light emitting diode but may be configured as a semiconductor laser device by forming resonators. As is well known, resonators can be formed by cleavage of crystal. In one embodiment, resonance planes can be formed on planes substantially perpendicular to the longitudinal direction of a stripe-shaped opening by cleavage or the like.

A display unit can be fabricated by arranging a number of the semiconductor light emitting devices according to an embodiment of the present invention. In such a display, it is possible to arrange the light emitting devices at a high density, and to facilitate the fabrication process by making an electrode common to the number of light emitting devices. Further, the display unit can be configured not only as a display unit for emission of light of a single color but also as a display unit for emission of light of multi-colors.

First Embodiment

A semiconductor light emitting device according to this embodiment will be described with reference to FIGS. 1A and 1B and FIG. 2.

Figure 1B:
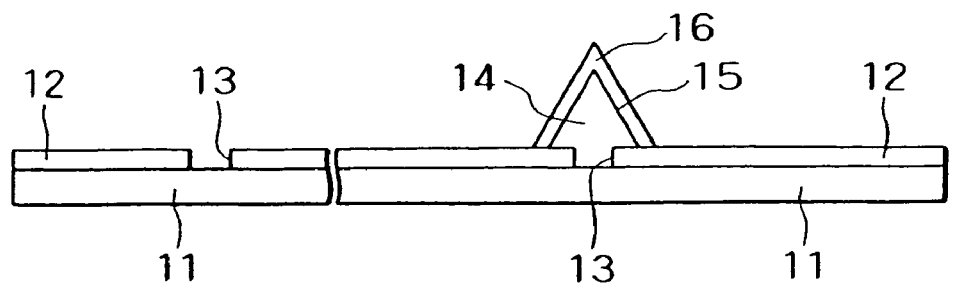
FIG. 1B is a sectional view taken on line b—b of FIG. 1A.

FIGS. 1A and 1B are a plan view and a sectional view showing a state of a semiconductor light emitting device before and after selective growth, respectively, wherein the left side of a cutaway line shows a state of an opening portion before selective growth and the right side of the cutaway line shows a state of the opening portion after selective growth.

As shown on the left side of the cutaway line of each of FIGS. 1A and 1B, in the state before selective growth, a base body 11 formed by stacking a lower growth layer on a sapphire substrate is prepared, and a selection mask 12 made from silicon oxide is formed on the base body 11. The base body 11 is formed by stacking, for example, an undoped GaN layer and a silicon-doped GaN layer on a sapphire substrate with the C-plane of sapphire taken as a principal plane thereof. A stripe-shaped opening portion 13 is formed in the selection mask 12 by forming a resist mask on the selection mask 12 and selectively etching the selection mask 12 via the resist mask by a hydrofluoric acid based etchant. In this embodiment, the longitudinal direction, that is, the direction along long-sides of the opening portion 13 is taken as a direction "q" in FIG. 1A. The direction "q" is taken as a (1-100) direction or a (11-20) direction for crystal growth of semiconductor layers having a ridge line 17.

After the elongated stripe-shaped opening portion 13 is formed, as shown on the right side of the cutaway line of each of FIGS. 1A and 1B, a silicon-doped GaN layer 14 is formed by selective growth from the opening portion 13, an InGaN layer 15 functioning as an active layer is formed on the silicon-doped GaN layer 14, and a magnesium-doped GaN layer 16 functioning as a second conductive type cladding layer is formed on the InGaN layer 15. The silicon-doped GaN layer 14 is a semiconductor layer, part of which functions as a first conductive type cladding layer. At the time of selective growth, the silicon-doped GaN layer 14 is grown in such a manner that the ridge line 17 thereof extends in the longitudinal direction of the opening portion 13 (i.e., in the direction "q" in FIG. 1A). A tilt plane 18 is formed on each of both sides of the ridge line 17. The tilt plane 18 is a (1-101) plane (called an S-plane) or (11-22) plane stably formed at the time of selective growth. At each of end portions on the short-sides of the opening portion 13, crystal is grown into the shape of a half of a hexagonal pyramid structure.

Figure 2:
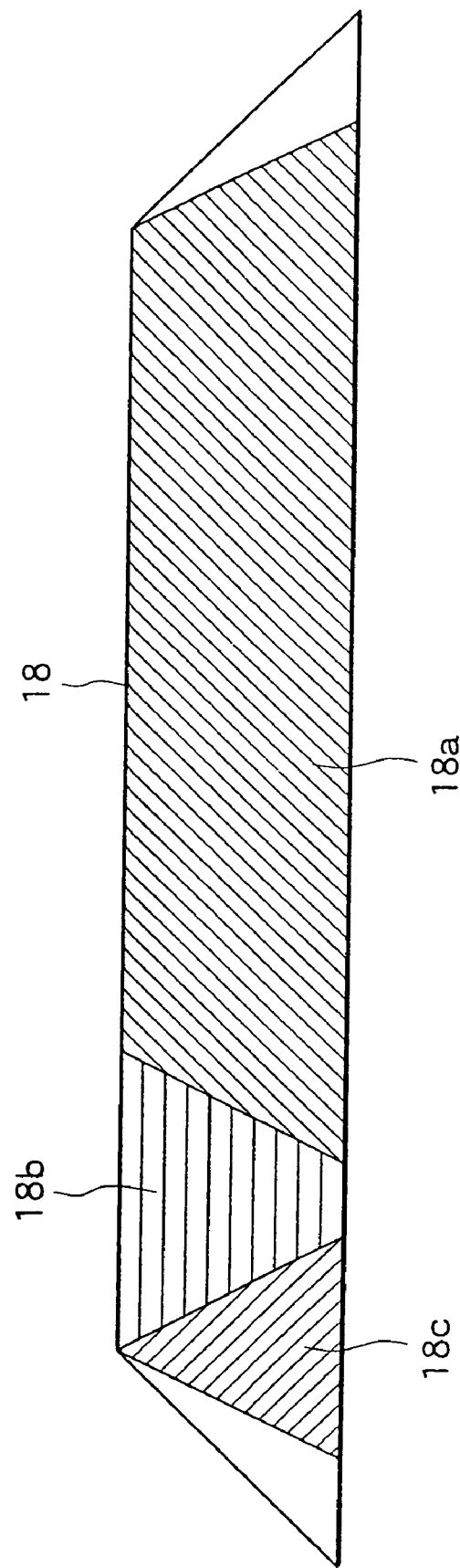
FIG. 2 is a side view of a portion of the semiconductor light emitting device according to the first embodiment, showing one of the tilt planes of the semiconductor layers and an electrode formed thereon.

FIG. 2 shows a result of observing one of the tilt planes 18 formed on both the sides of the ridge line 17 by AFM (Atomic Force Microscope). The tilt plane 18 observed by AFM has a region 18a in which large-sized regular crystal steps are formed. The tilt plane 18 also has small regions 18b and 18c on the side relatively close to one end. Since an area occupied by the region 18a having the regular crystal steps is large, an electrode can be formed substantially only in the region 18a. Accordingly, at the time of injecting a current via the electrode, carriers seldom pass through the small regions 18b and 18c. According to this embodiment, as compared with semiconductor layers having a hexagonal pyramid structure formed by crystal growth from an opening portion, it is possible to effectively inject a current in the planes which have the sufficiently regular crystal steps and thereby exhibit stable characteristics.

The tilt plane 18 mainly is the tilt plane of the silicon-doped GaN layer 14. However, since crystallinity of the crystal plane of the silicon-doped GaN layer 14 is directly reflected on the InGaN layer 15 and the magnesium-doped GaN layer 16 formed thereon, the tilt plane 18 can be substantially regarded as a crystal plane of each of the InGaN layer 15 and the magnesium-doped GaN layer 16. In the subsequent step, an electrode is formed on a device having the tilt planes 18 formed on both the sides of the ridge line 17, to obtain a light emitting diode.

Second Embodiment

Figure 3A:
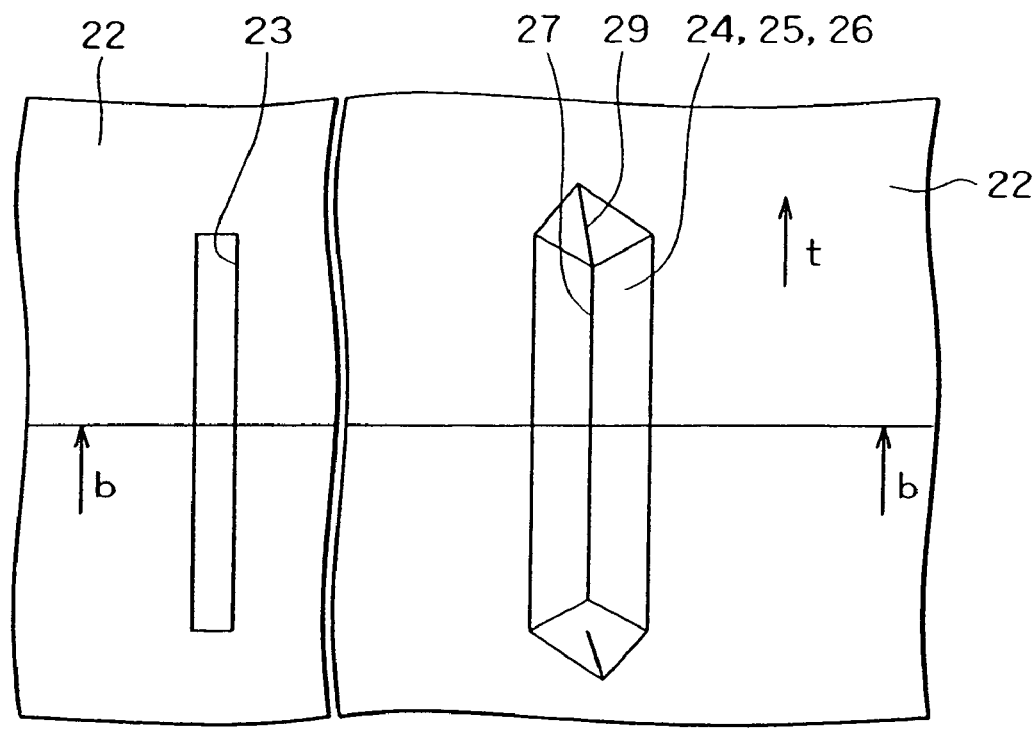
FIG. 3A is a plan view of a semiconductor light emitting device according to a second embodiment of the present invention, showing a state of the device before and after selective growth from an opening of a selection mask which is formed in such a manner as to extend with its longitudinal direction tilted from the (1-100) direction or the (11-20) direction by a slight angle.
Figure 3B:
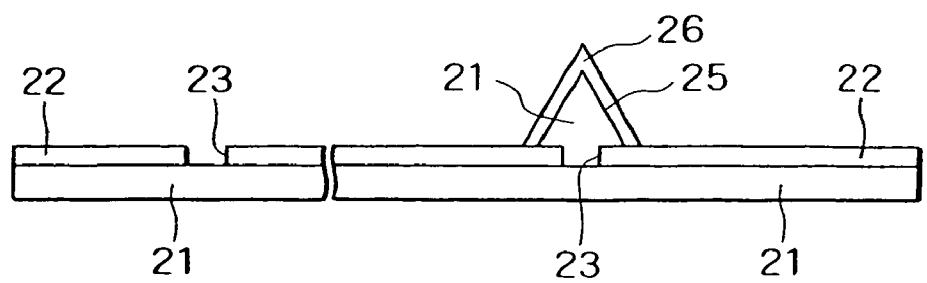
FIG. 3B is a sectional view taken on line b—b of FIG. 3A.

A semiconductor light emitting device according to this embodiment will be described with reference to FIGS. 3A and 3B and FIG. 4. FIGS. 3A and 3B are a plan view and a sectional view showing a state of a semiconductor light emitting device before and after selective growth, respectively, wherein the left side of a cutaway line shows a state of an opening portion before selective growth and the right side of the cutaway line shows a state of the opening portion after selective growth.

As shown on the left side of the cutaway line of each of FIGS. 3A and 3B, in the state before selective growth, a base body 21 formed by stacking a lower growth layer on a sapphire substrate is prepared, and a selection mask 22 made from silicon oxide is formed on the base body 21. The base body 21 is formed by stacking, for example, an undoped GaN layer and a silicon-doped GaN layer on a sapphire substrate with the C-plane of sapphire taken as a principal plane thereof. A stripe-shaped opening portion 23 is formed in the selection mask 22 by forming a resist mask on the selection mask 22 and selectively etching the selection mask 22 via the resist mask by a hydrofluoric acid based etchant. In this embodiment, the longitudinal direction, that is, the direction along long-sides of the opening portion 23 is taken as a direction "t" in FIG. 3A. The direction "t" is taken as a direction tilted from the (1-100) direction or the (11-20) direction by an angle ranging from about 0.2° to about 20° for crystal growth of semiconductor layers having a ridge line 27.

After the elongated stripe shaped opening portion 23 is formed, like the first embodiment, as shown on the right side of the cutaway line of each of FIGS. 3A and 3B, a silicon-doped GaN layer 24 is formed by selective growth from the opening portion 23, an InGaN layer 25 functioning as an active layer is formed on the silicon-doped GaN layer 24, and a magnesium-doped GaN layer 26 functioning as a second conductive type cladding layer is formed on the InGaN layer 25. The silicon-doped GaN layer 24 is a semiconductor layer, part of which functions as a first conductive type cladding layer. At the time of selective growth, the silicon-doped GaN layer 24 is grown such that the ridge line 27 thereof extends in the longitudinal direction of the opening portion 23, that is, in the direction "t" in FIG. 3A. Specifically, the ridge line 27 extends in the direction tilted from the (1-100) direction or the (11-20) direction by an angle ranging from about 0.2° to about 20°. In the example shown in the figures, the ridge line 27 extends in the direction tilted from the (11-20) direction by about 5°. A tilt plane 28 is formed on each of both sides of the ridge line 27. The tilt plane 28 is the (1-101) plane (S-plane) or the (11-22) plane stably formed at the time of selective growth. At each of the end portions on the short-sides of the opening portion 23, crystal is grown into the shape of a half of a hexagonal pyramid structure which has a short ridge line 29 obliquely offset from the direction "t".

Figure 4:
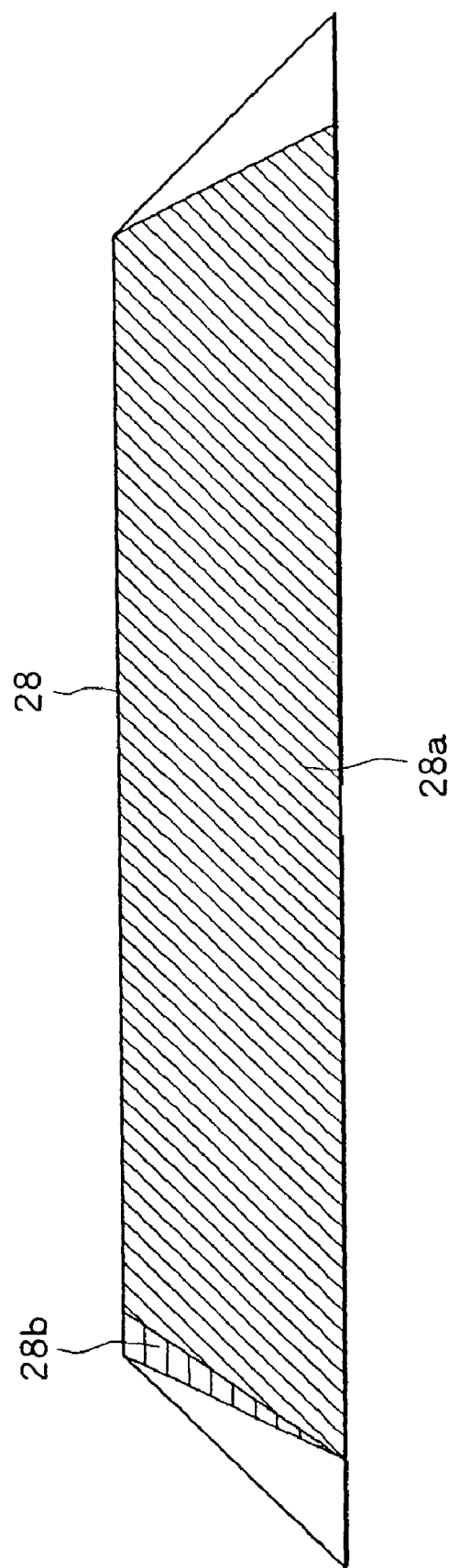
FIG. 4 is a side view of a portion of the semiconductor light emitting device according to the second embodiment, showing one of the tilt planes of the semiconductor layers and an electrode formed thereon.

FIG. 4 shows a result of observing one of the tilt planes 28 formed on both the sides of the ridge line 27 by AFM (Atomic Force Microscope). The tilt plane 28 observed by AFM has a region 28a in which large-sized regular crystal steps are formed. The tilt plane 28 also has a small region 28b having a different state of crystal steps from the region 28a. The small region 28b is located on the side relatively close to one end. According to this embodiment, since the region 28b is smaller than each of the small regions 18b and 18c in the first embodiment, it is possible to more effectively inject a current in the tilt planes which have the regular crystal steps and thereby exhibit stable characteristics.

The tilt plane 28 mainly is the tilt plane of the silicon-doped GaN layer 24. However, since crystallinity of the crystal plane of the silicon-doped GaN layer 24 is directly reflected on the InGaN layer 25 and the magnesium-doped GaN layer 26 formed thereon, the tilt plane 28 can be substantially regarded as a crystal plane of each of the InGaN layer 25 and the magnesium-doped GaN layer 26. In the subsequent step, an electrode is formed on a device having the tilt planes 28 formed on both the sides of the ridge line 27, to obtain a light emitting diode.

Third Embodiment

Figure 5A:
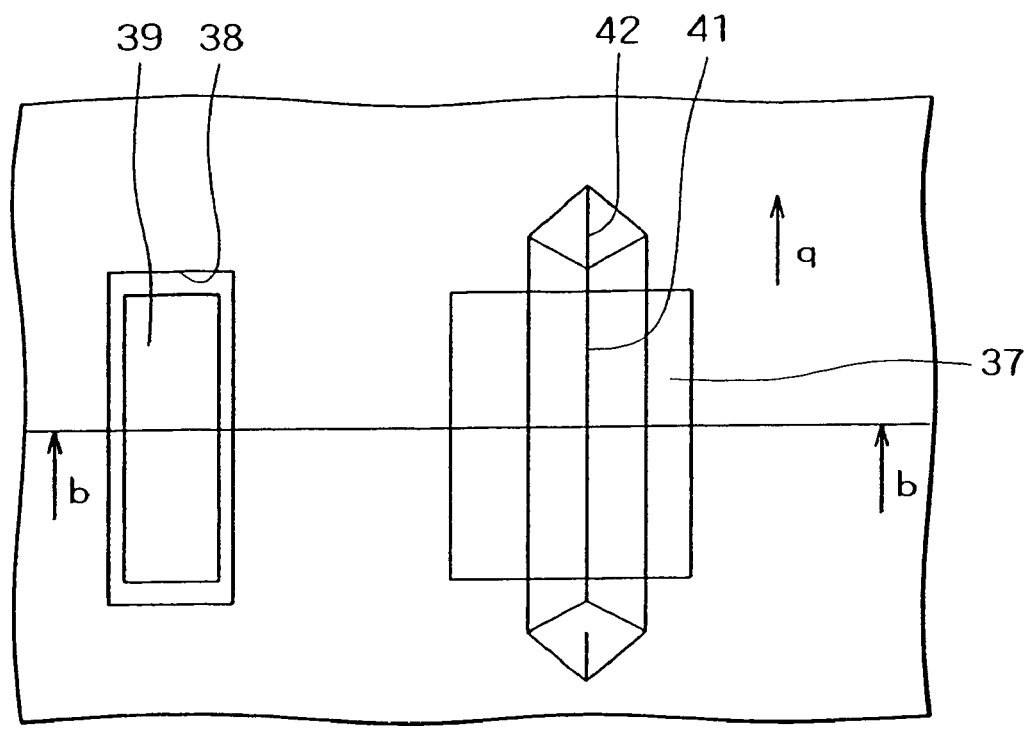
FIG. 5A is a plan view of a semiconductor light emitting device according to a third embodiment of the present invention, showing a state of the device before and after selective growth from an opening of a selection mask which is formed in such a manner as to extend in the (1-100) direction or the (11-20) direction.
Figure 5B:
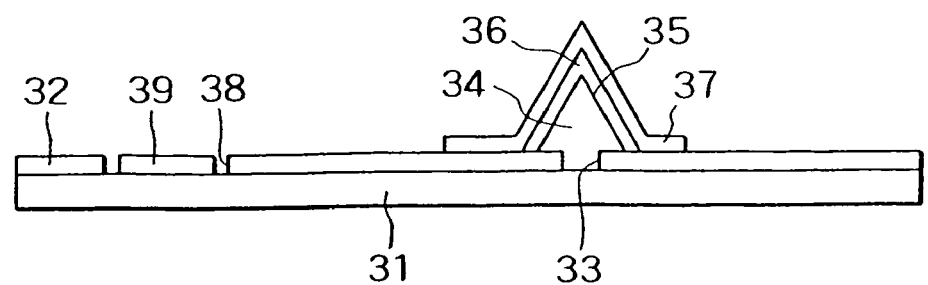
FIG. 5B is a sectional view taken on line b—b of FIG. 5A.
Figure 6:
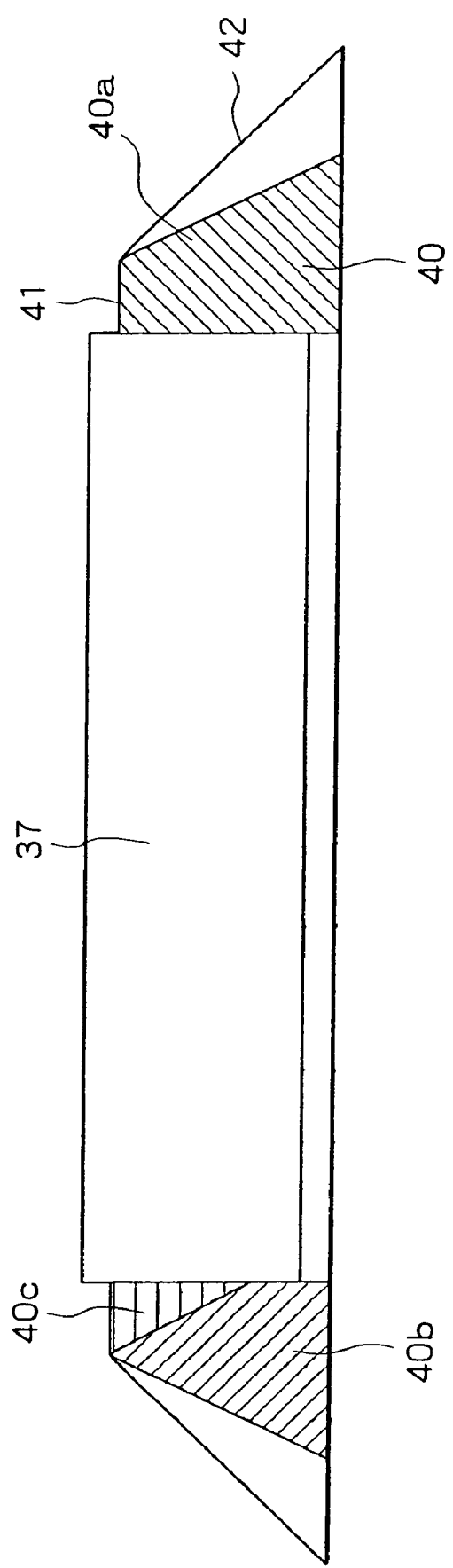
FIG. 6 is a side view of a portion of the semiconductor light emitting device according to the third embodiment, showing one of the tilt planes of the semiconductor layers and an electrode formed thereon.

A semiconductor light emitting device according to this embodiment will be described with reference to FIGS. 5A and 5B and FIG. 6. FIGS. 5A and 5B are a plan view and a sectional view showing a light emitting diode formed by selective growth, respectively. FIG. 6 is a side view of a portion of the light emitting diode shown in FIGS. 5A and 5B, showing one of tilt planes of semiconductor layers and an electrode formed thereon.

As shown in FIGS. 5A and 5B, a base body 31 formed by stacking a lower growth layer on a sapphire substrate is prepared, and a selection mask 32 made from silicon oxide is formed on the base body 31. The base body 31 is formed by stacking, for example, an undoped GaN layer and a silicon-doped GaN layer on a sapphire substrate with the C-plane of sapphire taken as a principal plane thereof. A stripe-shaped opening portion 33 extending with its longitudinal direction taken as a direction "q" in FIG. 5A is formed in the selection mask 32. The direction "q" is taken as the (1-100) direction or the (11-20) direction for crystal growth of semiconductor layers having a ridge line 41.

A silicon-doped GaN layer 34 as a semiconductor layer, part of which functions as a first conductive type cladding layer, is formed by selective growth from the elongated stripe-shaped opening portion 33, an InGaN layer 35 functioning as an active layer is formed on the silicon-doped GaN layer 34, and a magnesium-doped GaN layer 36 functioning as a second conductive type cladding layer is formed on the InGaN layer 35. The silicon-doped GaN layer 34 is formed by selective growth such that the ridge line 41 extends in the direction "q" in FIG. 5A. A tilt plane 40 is formed on each of both sides of the ridge line 41. The tilt plane 40 is the (1-101) plane (S-plane) or (11-22) plane stably formed at the time of selective growth.

A p-type electrode 37 is formed on the magnesium-doped GaN layer 36 as the second conductive type cladding layer. The p-type electrode 37 is typically an electrode layer having a stacked structure of Ni/Pt/Au, Ni(Pd)/Pt/Au, or the like. Each of the tilt planes 40 has a region 40a having regular crystal steps. According to this embodiment, the p-type electrode 37 is formed into a pattern having an approximately rectangular shape which mainly covers the regions 40a having the regular crystal steps. The tilt plane 40 also has small regions 40b and 40c, each having irregular crystal steps, on the side relatively close to one end. At each of end portions on the short-sides of the opening portion 33, a half of a hexagonal pyramid structure having a ridge line 42 is formed. As shown in FIG. 6, portions of the small regions 40b and 40c having the irregular crystal steps and the ridge lines 42 are not covered with the p-type electrode 37. Since an area occupied by the regions 40a having the regular crystal steps is large, the p-type electrode 37 can be formed substantially only in the regions 40a having the regular crystal steps. Accordingly, at the time of injecting a current via the p-type electrode 37, carriers seldom pass through the small regions 40b and 40c having the irregular crystal steps. As a result, it is possible to effectively inject a current in planes which have the regular crystal steps and thereby exhibit stable characteristics.

As described above, since the p-type electrode 37 is formed substantially only in the regions having the regular crystal steps, a current can be injected substantially only in the regions which have the regular crystal steps and thereby exhibit stable characteristics. As a result, it is possible to obtain a structure in which a light emission characteristic is independent of a variation between one and another of the devices. Since the p-type electrode 37 is not formed at steep pyramid shaped end portions of the magnesium-doped GaN layer 36, it is possible to facilitate patterning of the p-type electrode 37 by photolithography. In addition, the position of the p-type electrode 37 can be set on the basis of a result of AFM observation, and the p-type electrode 37 can be formed in an area excluding irregular crystal steps on the basis of experience or the like.

An n-type electrode 39 is formed in a rectangular opening portion 38 formed in the selection mask 32. The n-type electrode 39 typically has an electrode structure of Ti/Al/Pt/Au or the like, and is electrically connected via the base body 31 to the silicon-doped GaN layer 34 as the first conductive type cladding layer.

According to the semiconductor light emitting device in this embodiment, the p-type electrode 37 is formed substantially only in the regions 40a having the regular crystal steps located on the tilt planes 40 formed on both the sides of the ridge line 42 extending in the (1-100) direction or the (11-20) direction. As a result, a current can be injected substantially only in the regions which have the regular crystal steps and thereby exhibit stable characteristics, so that a light emission characteristic can be prevented from being affected by a variation between one and another of the devices. Since the p-type electrode 37 is not formed at steep pyramid shaped end portions of the magnesium-doped GaN layer 36, it is possible to facilitate patterning of the p-type electrode 37 by photolithography.

Fourth Embodiment

Figure 7A:
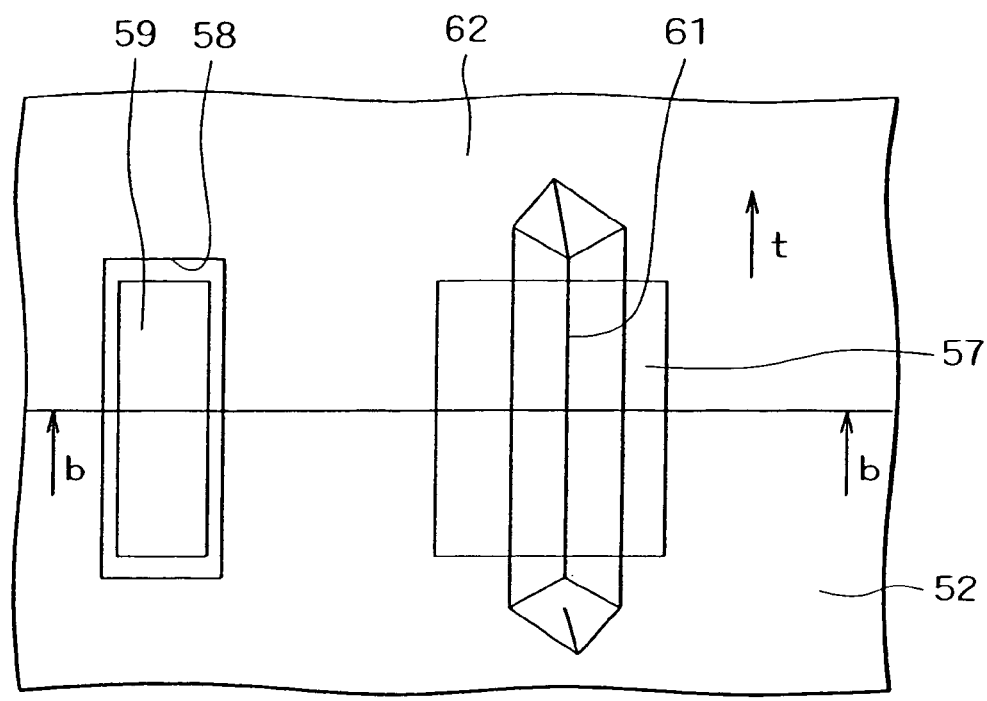
FIG. 7A is a plan view of a semiconductor light emitting device according to a fourth embodiment of the present invention, showing a state of the device before and after selective growth from an opening of a selection mask which is formed in such a manner as to extend with its longitudinal direction tilted from the (1-100) direction or the (11-20) direction by a slight angle.
Figure 7B:
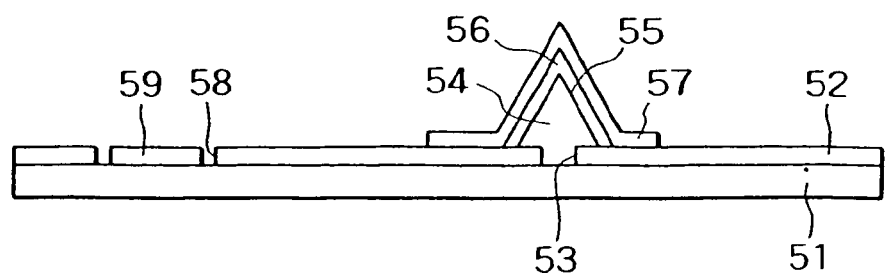
FIG. 7B is a sectional view taken on line b—b of FIG. 7A.
Figure 8:
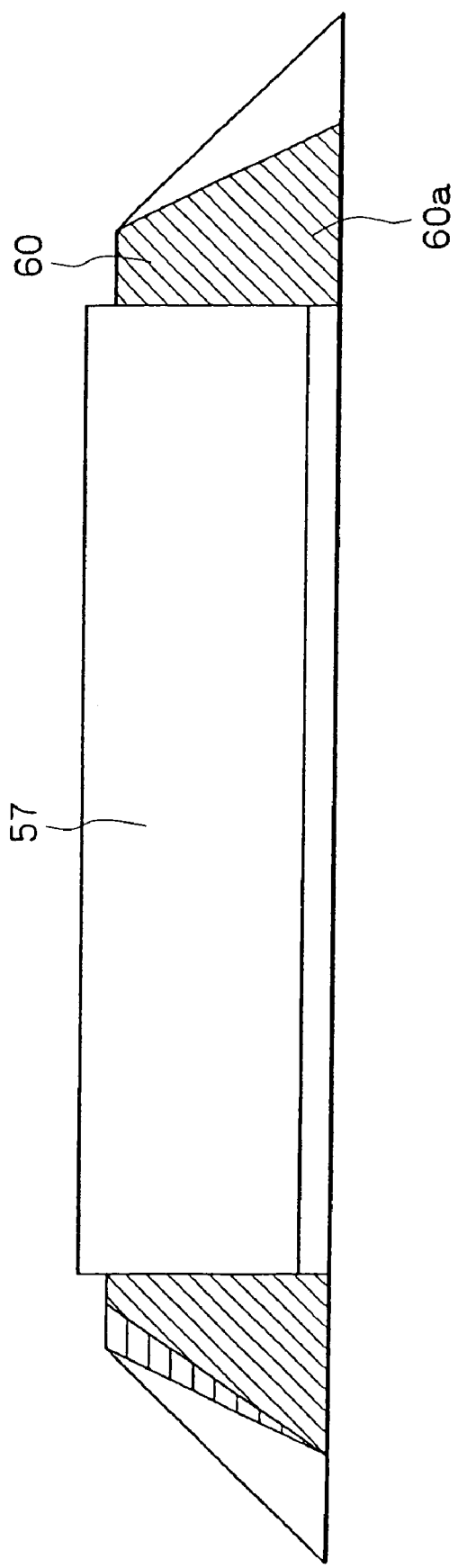
FIG. 8 is a side view of a portion of the semiconductor light emitting device according to the fourth embodiment, showing one of the tilt planes of the semiconductor layers and an electrode formed thereon.

A semiconductor light emitting device according to this embodiment will be described with reference to FIGS. 7A and 7B and FIG. 8. FIGS. 7A and 7B are a plan view and a sectional view showing a light emitting diode formed by selective growth, respectively. FIG. 8 is a side view of a portion of the light emitting diode shown in FIGS. 7A and 7B, showing one of tilt planes of semiconductor layers and an electrode formed thereon.

As shown in FIGS. 7A and 7B, a base body 51 formed by stacking a lower growth layer on a sapphire substrate is prepared, and a selection mask 52 made from silicon oxide is formed on the base body 51. The base body 51 is formed by stacking, for example, an undoped GaN layer and a silicon-doped GaN layer on a sapphire substrate with the C-plane of sapphire taken as a principal plane thereof. A stripe-shaped opening portion 53 extending with its longitudinal direction taken as a direction "t" in FIG. 7A is formed in the selection mask 52. The direction "t" is taken as a direction tilted from the (1-100) direction or the (11-20) direction by an angle ranging from about 0.2° to about 20° for crystal growth of semiconductor layers having a ridge line 61. In the example shown in the figures, the direction "t" is taken as a direction tilted from the (11-20) direction by an angle of about 5°.

A silicon-doped GaN layer 54 as a semiconductor layer, part of which functions as a first conductive type cladding layer, is formed by selective growth from the elongated stripe-shaped opening portion 53, an InGaN layer 55 functioning as an active layer is formed on the silicon-doped GaN layer 54, and a magnesium-doped GaN layer 56 functioning as a second conductive type cladding layer is formed on the InGaN layer 55. The silicon-doped GaN layer 54 is formed by selective growth such that the ridge line 61 extends in the direction "t" in FIG. 7A. A tilt plane 60 is formed on each of both sides of the ridge line 61. The tilt plane 60 is the (1-101) plane (S-plane) or (11-22) plane stably formed at the time of selective growth. In particular, like the second embodiment, since the longitudinal direction of the opening portion 53 of the selection mask 52 is taken as a direction tilted from the (1-100) direction or the (11-20) direction, regions in which irregular crystal steps are formed become smaller.

A p-type electrode 57 is formed on the magnesium-doped GaN layer 56 as the second conductive type cladding layer. The p-type electrode 57 is typically an electrode layer having a stacked structure of Ni/Pt/Au or Ni(Pd)/Pt/Au. Each of the tilt planes 60 has a region 60a in which regular crystal steps are formed. According to this embodiment, the p-type electrode 57 is formed into a pattern having an approximately rectangular shape which mainly covers the regions 60a having the regular crystal steps. The tilt plane 60 also has the small region having irregular crystal steps on the side relatively close to one end. At each of end portions on the short-sides of the opening portion 53, a half of a hexagonal pyramid structure having a ridge line 62 is formed. As shown in FIG. 8, portions of the small regions having the irregular crystal steps and the ridge lines 62 are not covered with the p-type electrode 57. Since an area occupied by the regions having the irregular crystal steps is significantly small, the p-type electrode 57 can be formed substantially only in the regions 60a having the regular crystal steps. Accordingly, at the time of injecting a current via the p-type electrode 57, carriers mainly pass through the regions 60a having the regular crystal steps. As a result, it is possible to stabilize device characteristics such as a light emission characteristic.

As described above, since the p-type electrode 57 is formed substantially only in the regions having the regular crystal steps, a current can be injected substantially only in the regions which have the regular crystal steps and thereby exhibit stable characteristics. As a result, it is possible to obtain a structure in which a light emission characteristic is independent of a variation between one and another of the devices.

Since the p-type electrode 57 is not formed at steep pyramid shaped end portions of the magnesium-doped GaN layer 56, it is possible to facilitate patterning of the p-type electrode 57 by photolithography. In addition, the position of the p-type electrode 57 can be set on the basis of a result of AFM observation, and the p-type electrode 57 can be formed in an area excluding irregular crystal steps on the basis of experience or the like.

An n-type electrode 59 is formed in a rectangular opening portion 58 formed in the selection mask 52. The n-type electrode 59 typically has an electrode structure of Ti/Al/Pt/Au or the like, and is electrically connected via the base body 51 to the silicon-doped GaN layer 54 as the first conductive type cladding layer.

According to the semiconductor light emitting device in this embodiment, since the longitudinal direction of the opening portion 53 of the selection mask 52 is taken as a direction tilted from the (1-100) direction or the (11-20) direction by an angle ranging from about 0.2° to about 20°, the regions having the irregular crystal steps can be made significantly small, and the p-type electrode 57 can be formed substantially only in the regions having the regular crystal steps on the tilt planes 60 on both the sides of the ridge line 61. As a result, since a current can be injected substantially only in the regions which have the regular crystal steps and thereby exhibit stable characteristics, it is possible to obtain a structure in which a light emission characteristic is independent of a variation between one and another of the devices. Since the p-type electrode 57 is not formed at steep pyramid shaped end portions of the magnesium-doped GaN layer 56, it is possible to facilitate patterning of the p-type electrode 57 by photolithography.

Fifth Embodiment

Figure 9:
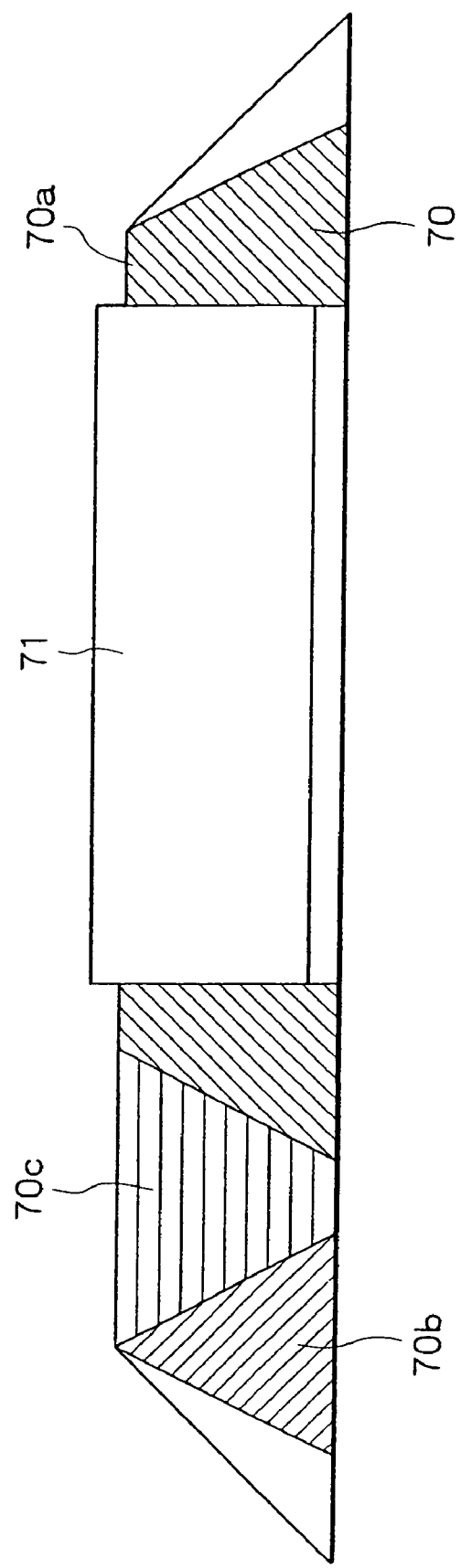
FIG. 9 is a side view of a portion of the semiconductor light emitting device according to a fifth embodiment, showing one of the tilt planes of the semiconductor layers and an electrode formed thereon.

In this embodiment, p-type electrodes 71 are formed in an area excluding portions each having irregular crystal steps. For simplicity of description, this embodiment will be described with reference to only FIG. 9, which is a side view showing a formation pattern of the p-type electrode 71, and regions 70a, 70b and 70c formed on each of tilt planes 70 of GaN layers.

The p-type electrode 71 is an electrode layer having a stacked structure of Ni/Pt/Au or the like. In this embodiment, each p-type electrode 71 is formed into a pattern located in the region 70a having regular crystal steps while avoiding the regions 70b and 70c each having irregular crystal steps. The p-type electrode 71 is smaller than that described in each of the previous embodiments. However, according to this embodiment, since the p-type electrode 71 is formed in the area excluding the regions 70b and 70c having the irregular crystal steps, it is possible to suppress a variation between one and another of the devices.

Sixth Embodiment

Figure 10A:
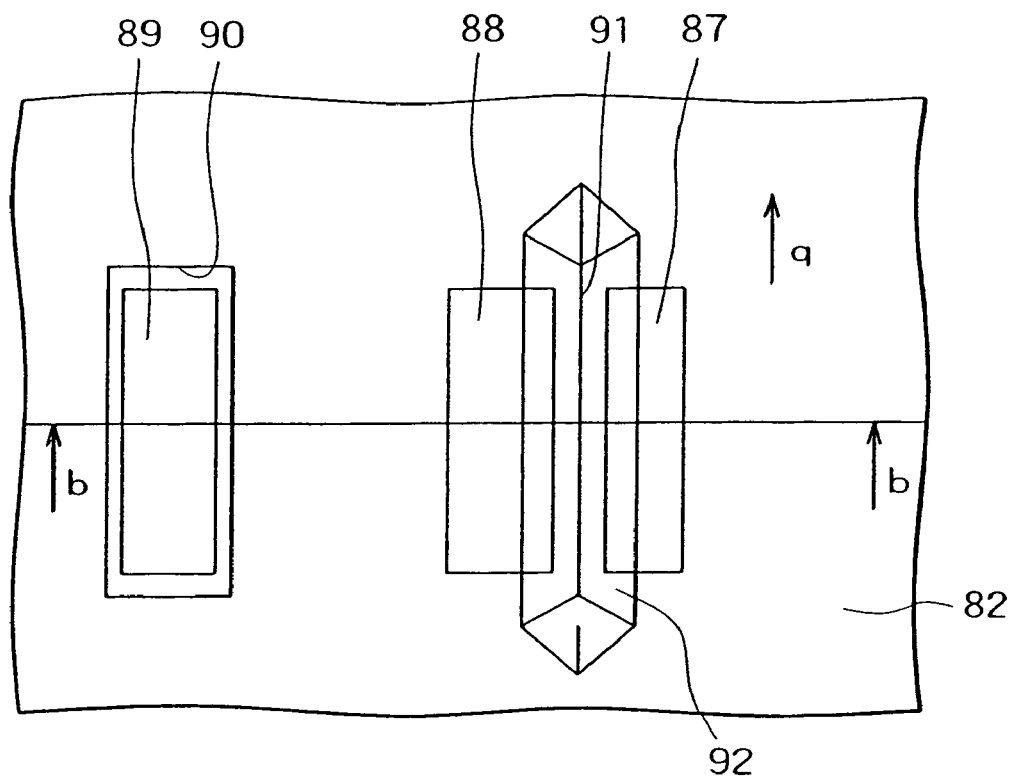
FIG. 10A is a plan view of a semiconductor light emitting device according to a sixth embodiment of the present invention, showing a state of the device before and after selective growth from an opening of a selection mask which is formed in such a manner as to extend in a (1-100) direction or a (11-20) direction.
Figure 10B:
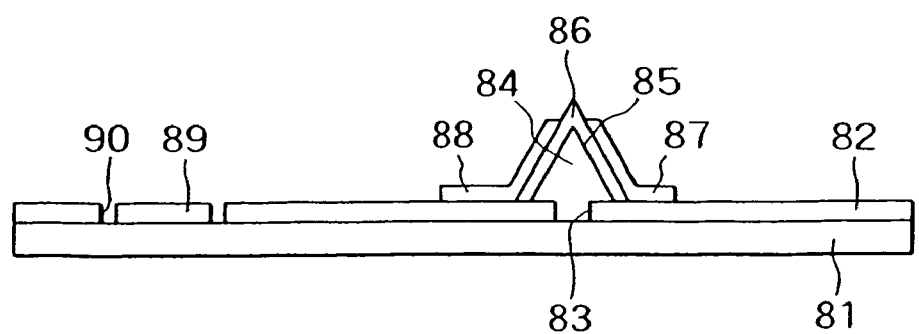
FIG. 10B is a sectional view taken on line b—b of FIG. 10A.
Figure 11:
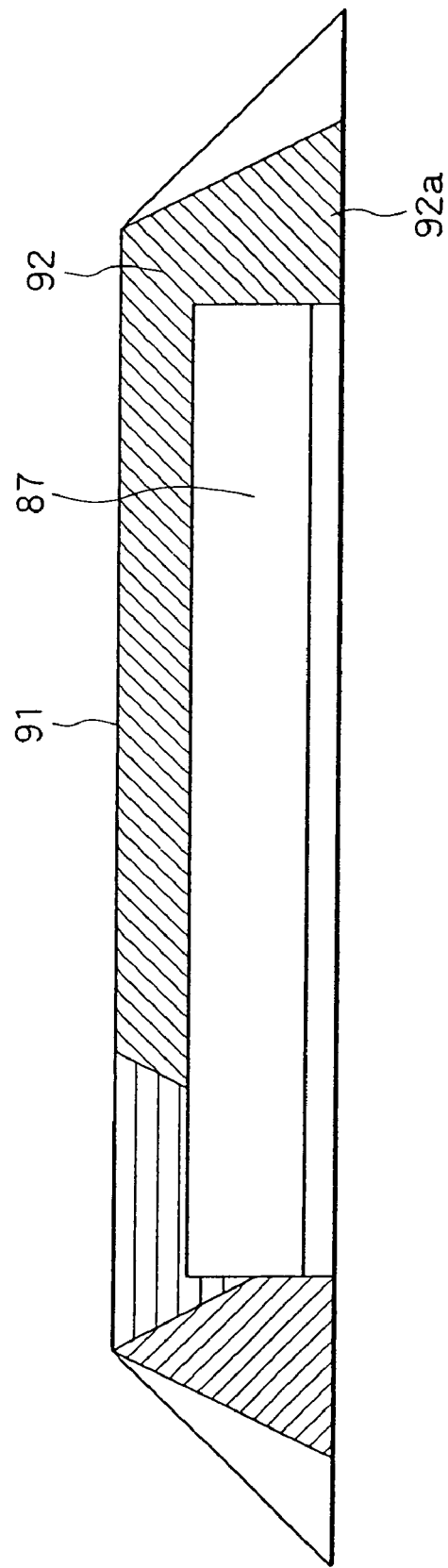
FIG. 11 is a side view of a portion of the semiconductor light emitting device according to the sixth embodiment, showing one of the tilt planes of the semiconductor layers and an electrode formed thereon.

A semiconductor light emitting device according to this embodiment will be described with reference to FIGS. 10A and 10B and FIG. 11. FIGS. 10A and 10B are a plan view and a sectional view showing a light emitting diode formed by selective growth, respectively. FIG. 11 is a side view of a portion of the light emitting diode shown in FIGS. 10A and 10B, showing one of tilt planes of semiconductor layers and an electrode formed thereon.

As shown in FIGS. 10A and 10B, a base body 81 formed by stacking a lower growth layer on a sapphire substrate is prepared, and a selection mask 82 made from silicon oxide is formed on the base body 81. The base body 81 is formed by stacking, for example, an undoped GaN layer and a silicon-doped GaN layer on a sapphire substrate with the C-plane of sapphire taken as a principal plane thereof. A stripe-shaped opening portion 83 extending with its longitudinal direction taken as a direction "q" in FIG. 10A is formed in the selection mask 82. Like the third embodiment, the direction "q" is taken as the (1-100) direction or the (11-20) direction for crystal growth of semiconductor layers having a ridge line 91.

A silicon-doped GaN layer 84 as a semiconductor layer, part of which functions as a first conductive type cladding layer, is formed by selective growth from such an elongated stripe-shaped opening portion 83, an InGaN layer 85 functioning as an active layer is formed on the silicon-doped GaN layer 84, and a magnesium-doped GaN layer 86 functioning as a second conductive type cladding layer is formed on the InGaN layer 85. The silicon-doped GaN layer 84 is formed by selective growth in such a manner that the ridge line 91 extends in the direction "q" in FIG. 10A. A tilt plane 92 is formed on each of both sides of the ridge line 91. The tilt plane 92 is the (1-101) plane (S-plane) or (11-22) plane stably formed at the time of selective growth.

P-type electrodes 87 and 88 are formed on the magnesium-doped GaN layer 86 as the second conductive type cladding layer. Each of the p-type electrodes 87 and 88 is typically an electrode layer having a stacked structure of Ni/Pt/Au or Ni(Pd)/Pt/Au or the like. Each of the tilt planes 92 has a region 92a in which regular crystal steps are formed. According to this embodiment, the p-type electrode 87 is formed into a pattern having an approximately rectangular shape which mainly covers one of the regions 92a having the regular crystal steps while the p-type electrode 88 is formed into a pattern having an approximately rectangular shape which mainly covers the other of the regions 92a having the regular crystal steps. As shown in FIG. 11, unstable crystal regions located in the vicinity of the ridge line 91 equivalent to a top portion of a triangular shape in cross-section, and portions near the ridge line on both end sides are not covered with the p-type electrodes 87 and 88. Since the p-type electrodes 87 and 88 are formed only in the regions 92a having the regular crystal steps, that is, are not formed in the regions with undesirable crystallinity located near the ridge line 91 and the portions with undesirable crystallinity located near the ridge line on both the end sides, these regions and portions with undesirable crystallinity can be left out of a route through which a current is injected. As a result, it is possible to realize a device operation with stable characteristics.

As described above, since the p-type electrodes 87 and 88 are formed only in the regions having the regular crystal steps, it is possible to inject a current only in the regions having stable characteristics, and hence to obtain a structure in which a light emission characteristic is independent of a variation between one and another of the devices. Since the p-type electrodes 87 and 88 are not formed at steep pyramid shaped end portions of the magnesium-doped GaN layer 86, it is possible to facilitate patterning of the p-type electrodes 87 and 88 by photolithography. In addition, the positions of the p-type electrodes 87 and 88 can be set on the basis of a result of AFM observation, and the p-type electrodes 87 and 88 can be formed in an area excluding irregular crystal steps on the basis of experience or the like.

An n-type electrode 89 is formed in a rectangular opening portion 90 formed in the selection mask 82. The n-type electrode 89 typically has an electrode structure of Ti/Al/Pt/Au or the like, and is electrically connected via the base body 81 to the silicon-doped GaN layer 84 as the first conductive type cladding layer.

According to the semiconductor light emitting device in this embodiment, the p-type electrodes 87 and 88 are formed only in the regions 92a, which have the regular crystal steps formed on the tilt planes 92 on both the sides of the ridge line 91 extending in the (1-100) direction or the (11-20) direction, that is, are not formed in the regions in the vicinity of the ridge line 91. Accordingly, it is possible to easily stabilize device characteristics, and hence to obtain a structure in which a light emission characteristic is independent of a variation between one and another of devices. Since the p-type electrodes 87 and 88 are not formed at steep pyramid shaped end portions of the magnesium-doped GaN layer 86, it is possible to facilitate patterning of the p-type electrodes 87 and 88 by photolithography.

Seventh Embodiment

Figure 12A:
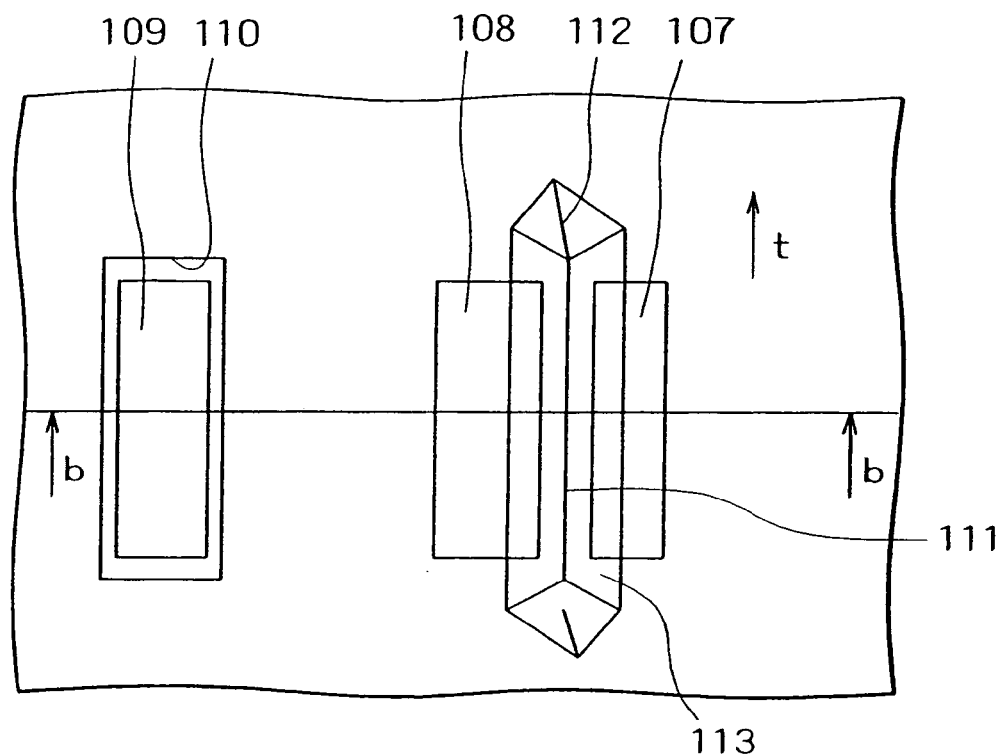
FIG. 12A is a plan view of a semiconductor light emitting device according to a seventh embodiment of the present invention, showing a state of the device before and after selective growth from an opening of a selection mask which is formed in such a manner as to extend with its longitudinal direction tilted from the (1-100) direction or the (11-20) direction by a slight angle.
Figure 12B:
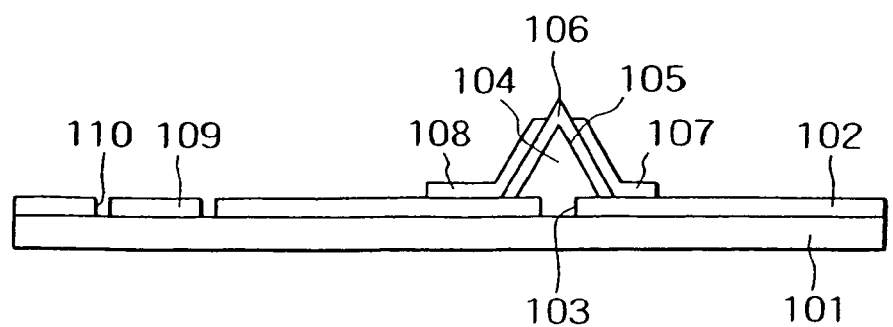
FIG. 12B is a sectional view taken on line b—b of FIG. 12A.

A semiconductor light emitting device according to this embodiment will be described with reference to FIGS. 12A and 12B and FIG. 13. FIGS. 12A and 12B are a plan view and a sectional view showing a light emitting diode formed by selective growth. FIG. 13 is a side view of a portion of the light emitting diode shown in FIGS. 12A and 12B, showing one of tilt planes of semiconductor layers and an electrode formed thereon.

As shown in FIGS. 12A and 12B, a base body 101 formed by stacking a lower growth layer on a sapphire substrate is prepared, and a selection mask 102 made from silicon oxide is formed on the base body 101. The base body 101 is formed by stacking, for example, an undoped GaN layer and a silicon-doped GaN layer on a sapphire substrate with the C-plane of sapphire taken as a principal plane thereof A stripe-shaped opening portion 103 extending with its longitudinal direction taken as a direction "t" in FIG. 12A is formed in the selection mask 102. The direction "t" is taken as a direction tilted from the (1-100) direction or the (11-20) direction by an angle ranging from about 0.2° to about 20° for crystal growth of semiconductor layers having a ridge line 111. In the example shown in the figures, the direction "t" is taken as a direction tilted from the (11-20) direction by about 5°.

A silicon-doped GaN layer 104 as a semiconductor layer, part of which functions as a first conductive type cladding layer, is formed by selective growth from the elongated stripe-shaped opening portion 103, an InGaN layer 105 functioning as an active layer is formed on the silicon-doped GaN layer 104, and a magnesium-doped GaN layer 106 functioning as a second conductive type cladding layer is formed on the InGaN layer 105. The silicon-doped GaN layer 104 is formed by selective growth such that the ridge line 111 extends in the direction "t" in FIG. 12A. A tilt plane 113 is formed on each of both sides of the ridge line 111. The tilt plane 113 is the (11-101) plane (S-plane) or (11-22) plane stably formed at the time of selective growth. In particular, like the second and fourth embodiments, the longitudinal direction of the opening portion 103 of the selection mask 102 is taken as the direction tilted by the (1-100) direction or the (11-20) direction and regions having irregular crystal steps are small.

P-type electrodes 107 and 108 are formed on the magnesium-doped GaN layer 106 as the second conductive type cladding layer. Each of the p-type electrodes 107 and 108 is typically an electrode layer having a stacked structure of Ni/Pt/Au or Ni(Pd)/Pt/Au or the like. Each of the tilt planes 113 has a region 113a in which regular crystal steps are formed. According to this embodiment, the p-type electrode 107 is formed into a pattern having an approximately rectangular shape which mainly covers one of the regions 113a having the regular crystal steps while the p-type electrode 108 is formed into a pattern having an approximately rectangular shape which mainly covers the other of the regions 113a having the regular crystal steps. As shown in FIG. 13, unstable crystal regions located in the vicinity of the ridge line 111 equivalent to a top portion of a triangular shape in cross-section, and portions near the ridge line on both end sides are not covered with the p-type electrodes 107 and 108. Since the p-type electrodes 107 and 108 are formed only in the regions 113a having the regular crystal steps, that is, are not formed in the regions with undesirable crystallinity located near the ridge line 111 and the portions with undesirable crystallinity located near the ridge line on both the end sides, it is possible to stabilize device characteristics and hence to realize a device operation with stable characteristics.

As described above, since the p-type electrodes 107 and 108 are formed only in the regions having the regular crystal steps, it is possible to inject a current only in the regions having stable characteristics, and hence to obtain a structure in which a light emission characteristic is independent of a variation between one and another of the devices. Since the p-type electrodes 107 and 108 are not formed at steep pyramid shaped end portions of the magnesium-doped GaN layer 106, it is possible to facilitate patterning of the p-type electrodes 107 and 108 by photolithography. In addition, the positions of the p-type electrodes 107 and 108 can be set on the basis of a result of AFM observation, and the p-type electrodes 107 and 108 can be formed in an area excluding irregular crystal steps on the basis of experience or the like.

An n-type electrode 109 is formed in a rectangular opening portion 110 formed in the selection mask 102. The n-type electrode 109 typically has an electrode structure of Ti/Al/Pt/Au or the like, and is electrically connected via the base body 101 to the silicon-doped GaN layer 104 as the first conductive type cladding layer.

According to the semiconductor light emitting device in this embodiment, since the longitudinal direction of the opening portion 103 of the selection mask 102 is taken as the direction tilted from the (1-100) direction or the (11-20) direction by an angle ranging from about 0.2° to about 20°, the regions having the irregular crystal steps can be made significantly small and thereby the p-type electrodes 107 and 108 can be formed only in the regions 113a having the regular crystal steps located on the tilt planes 113 on both the sides of the ridge line 111. Accordingly, it is possible to inject a current only in the regions which have the regular crystal steps and thereby exhibit stable characteristics, and hence to obtain a structure in which a light emission characteristic is independent of a variation between one and another of the devices. Since the p-type electrodes 107 and 108 are not formed at steep pyramid shaped end portions of the magnesium-doped GaN layer 106, it is possible to facilitate patterning of the p-type electrodes 107 and 108 by photolithography.

Eighth Embodiment

Figure 14:
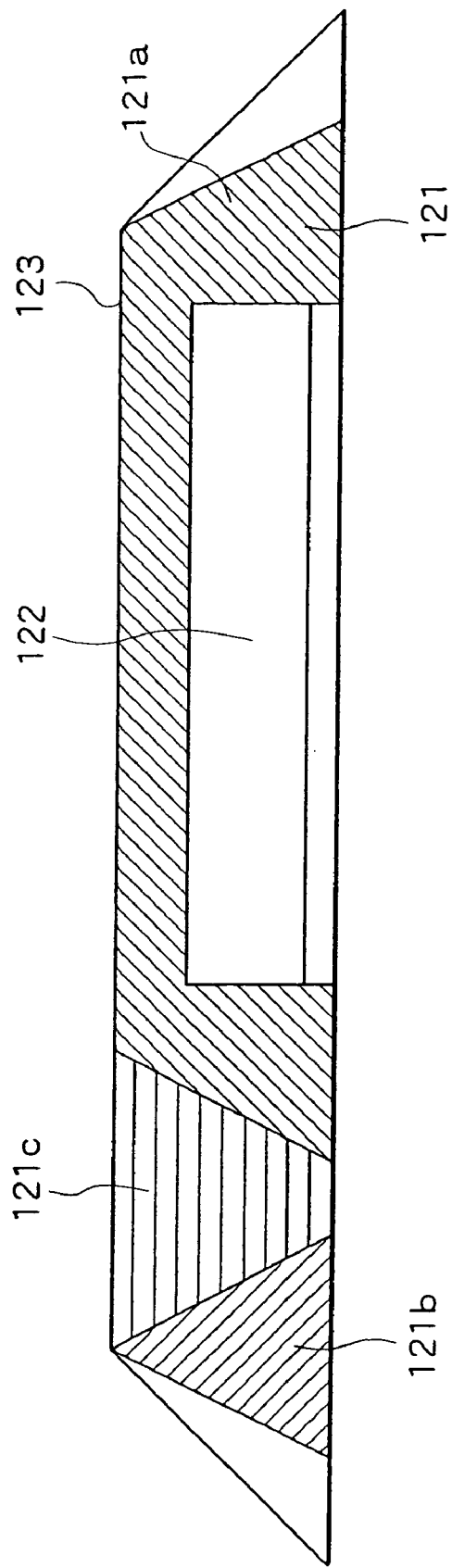
FIG. 14 is a side view of a portion of the semiconductor light emitting device according to an eighth embodiment, showing one of the tilt planes of the semiconductor layers and an electrode formed thereon.

In this embodiment, p-type electrodes 122 are formed in an area excluding portions having irregular crystal steps. For simplicity of description, this embodiment will be described with reference to only FIG. 14, which shows a formation pattern of the p-type electrode 122, and regions 121a, 121b and 121c formed on each of tilt planes 121 of GaN layers.

The p-type electrode 122 is an electrode layer having a stacked structure of Ni/Pt/Au or the like. In this embodiment, each p-type electrode 122 is formed into a pattern located in the region 121a having regular crystal steps. Formation of the p-type electrode 122 avoids the regions 121b and 121c each having irregular crystal steps and portions in the vicinity of a ridge line 123. The p-type electrode 122 is smaller than that described in each of the previous embodiments. However, according to this embodiment, since the p-type electrode 122 is formed in the area excluding the regions 121b and 121c each having the irregular crystal steps and the portions in the vicinity of the ridge line 123, it is possible to suppress a variation between one and another of the devices.

Ninth Embodiment

In this embodiment, metal electrodes are formed along a ridge line portion of semiconductor layers of a light emitting diode which has a structure similar to that described in the eighth embodiment. A structure of the light emitting diode in this embodiment is shown in FIG. 15.

Figure 15:
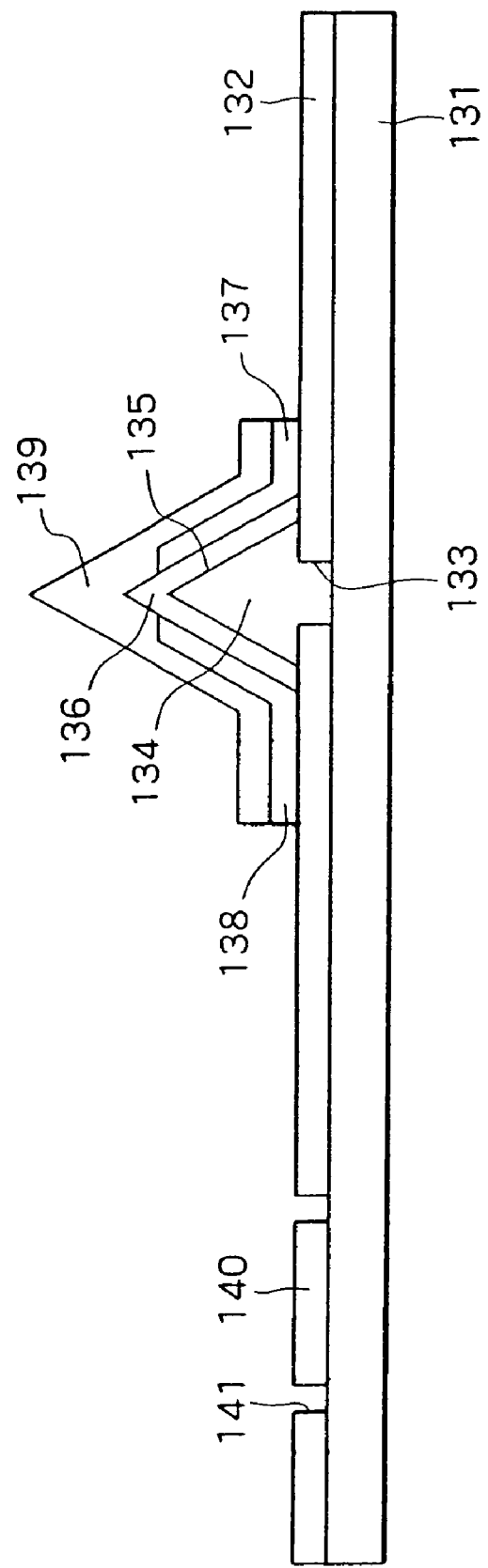
FIG. 15 is a sectional view showing a portion of a semiconductor light emitting device according to a ninth embodiment of the present invention.

As shown in FIG. 15, like the previous embodiments, a base body 131 formed by stacking a lower growth layer on a sapphire substrate is prepared, and a selection mask 132 made from silicon oxide is formed on the base body 131. A stripe-shaped opening portion 133 extending with its longitudinal direction taken as the (1-100) direction or (11-20) direction is formed in the selection mask 132.

A silicon-doped GaN layer 134 as a semiconductor layer, parts of which functions as a first conductive type cladding layer, is formed by selective growth from the opening portion 133, an InGaN layer 135 functioning as an active layer is formed on the silicon-doped GaN layer 134, and a magnesium-doped GaN layer 136 functioning as a second conductive type cladding layer is formed on the InGaN layer 135. The silicon-doped GaN layer 134 is formed by selective growth such that a ridge line extends in the (1-100) direction or the (11-20) direction. A tilt plane is formed on each of both sides of the ridge line. The tilt plane is the (1-101) plane (S-plane) or (11-22) plane stably formed at the time of selective growth.

P-type electrodes 137 and 138 are formed on the magnesium-doped GaN layer 136 as the second conductive type cladding layer. Each of the p-type electrodes 137 and 138 is typically an electrode layer having a stacked structure of Ni/Pt/Au or Ni(Pd)/Pt/Au or the like. Each of the tilt planes has a region in which regular crystal steps are formed. According to this embodiment, the p-type electrode 137 is formed into a pattern having an approximately rectangular shape which mainly covers one of the regions having the regular crystal steps while the p-type electrode 138 is formed into a pattern having an approximately rectangular shape which mainly covers the other of the regions having the regular crystal steps. As shown in FIG. 15, unstable crystal regions located in the vicinity of the ridge line equivalent to a top portion of a triangular shape in cross-section, and portions near the ridge line on both end sides are not covered with the p-type electrodes 137 and 138. Since the p-type electrodes 137 and 138 are formed only in the regions having the regular crystal steps, that is, are not formed in the regions with undesirable crystallinity located near the ridge line and the portions with undesirable crystallinity located near the ridge line on both the end sides, it is possible to realize a device operation with stable characteristics. Thus, it is possible to obtain a structure in which a light emission characteristic is independent of a variation between one and another of the devices.

As a feature of this embodiment, in place of formation of the p-type electrodes 137 and 138 in the vicinity of the ridge line, a metal reflection film 139, typically made from silver, is formed such as to cover the entire device portion. The formation of the metal reflection film 139 allows light emitted from the active layer to be reflected from the surface of the metal reflection film 139, thereby effectively enhancing luminous efficiency. An n-type electrode 140 is formed in a rectangular opening portion 141 formed in the selection mask 132. The n-type electrode 140 typically has an electrode structure of Ti/Al/Pt/Au or the like, and is electrically connected via the base body 131 to the silicon-doped GaN layer 134 as the first conductive type cladding layer.

According to the semiconductor light emitting device in this embodiment, the p-type electrodes 137 and 138 are formed in the regions located on both the sides of the ridge line extending in the (1-100) direction or the (11-20) direction while excluding the portions in the vicinity of the ridge line. Accordingly, it is possible to easily stabilize device characteristics, and hence to obtain a structure in which a light emission characteristic is independent of a variation between one and another of the devices. Since the p-type electrodes 137 and 138 are not formed at steep pyramid shaped end portions of the magnesium-doped GaN layer 136, it is possible to facilitate patterning of the p-type electrodes 137 and 138 by photolithography. Since the metal reflection film 139 is formed in such a manner as to cover the entire device portion, it is possible to allow light emitted from the active layer to be reflected from the surface of the metal reflection film 139, thereby increasing the luminous efficiency.

Tenth Embodiment

Figure 16A:
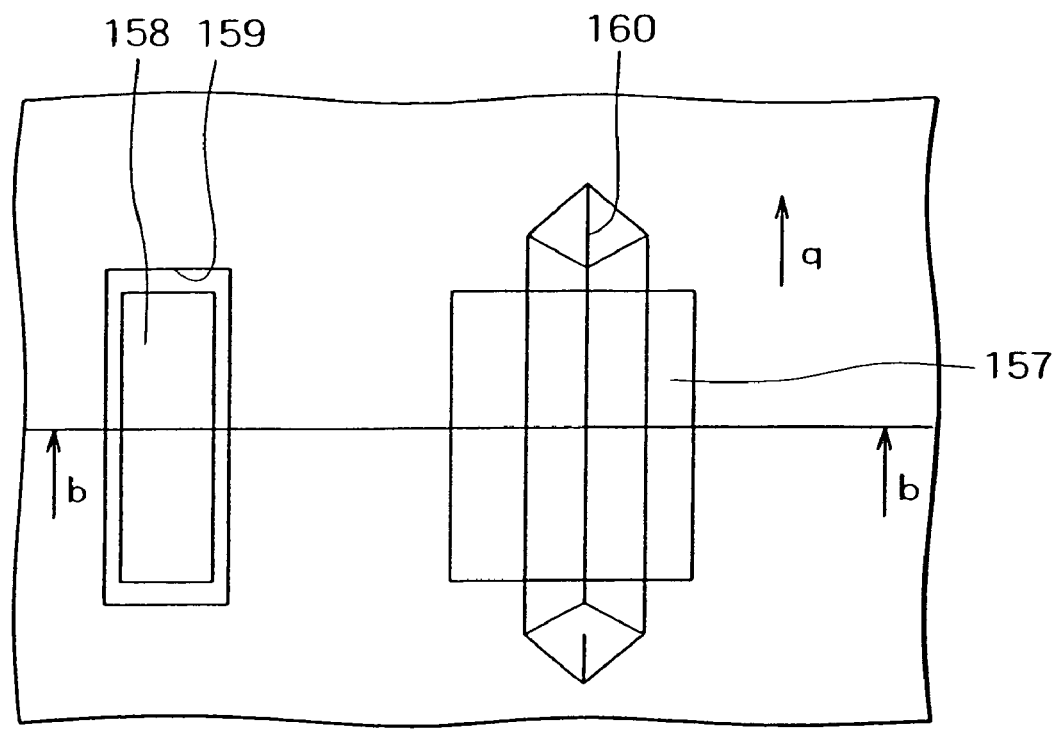
Figure 16B:
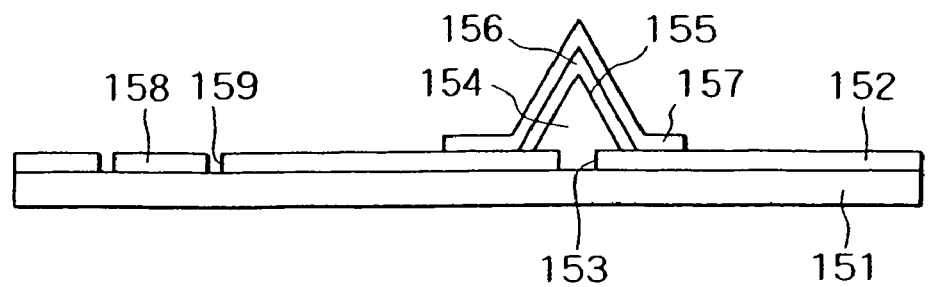
Figure 18A:
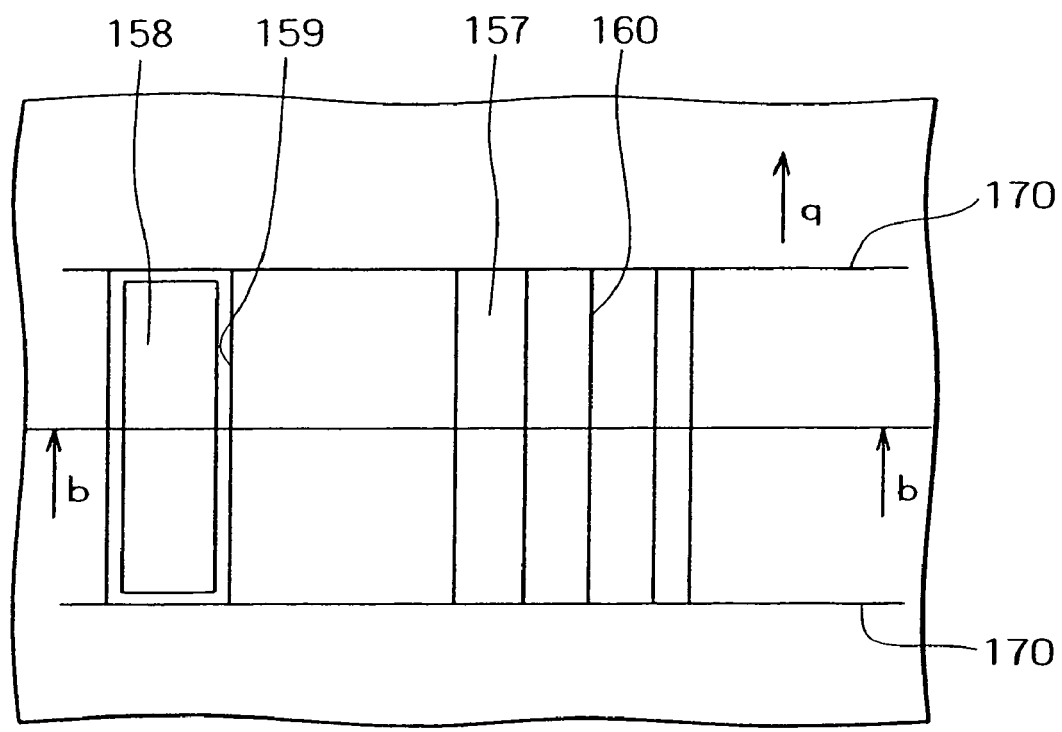
Figure 18B:
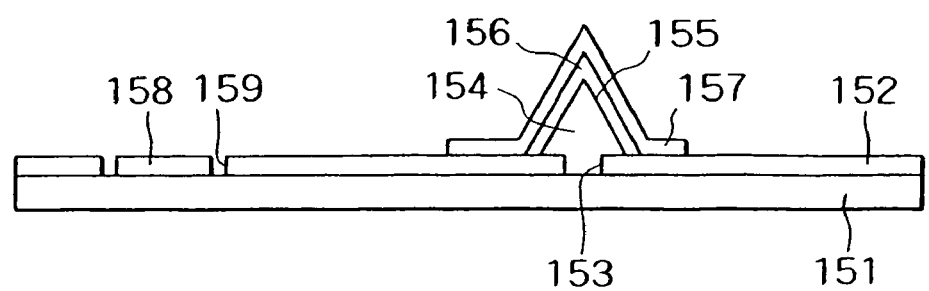
Figure 19:
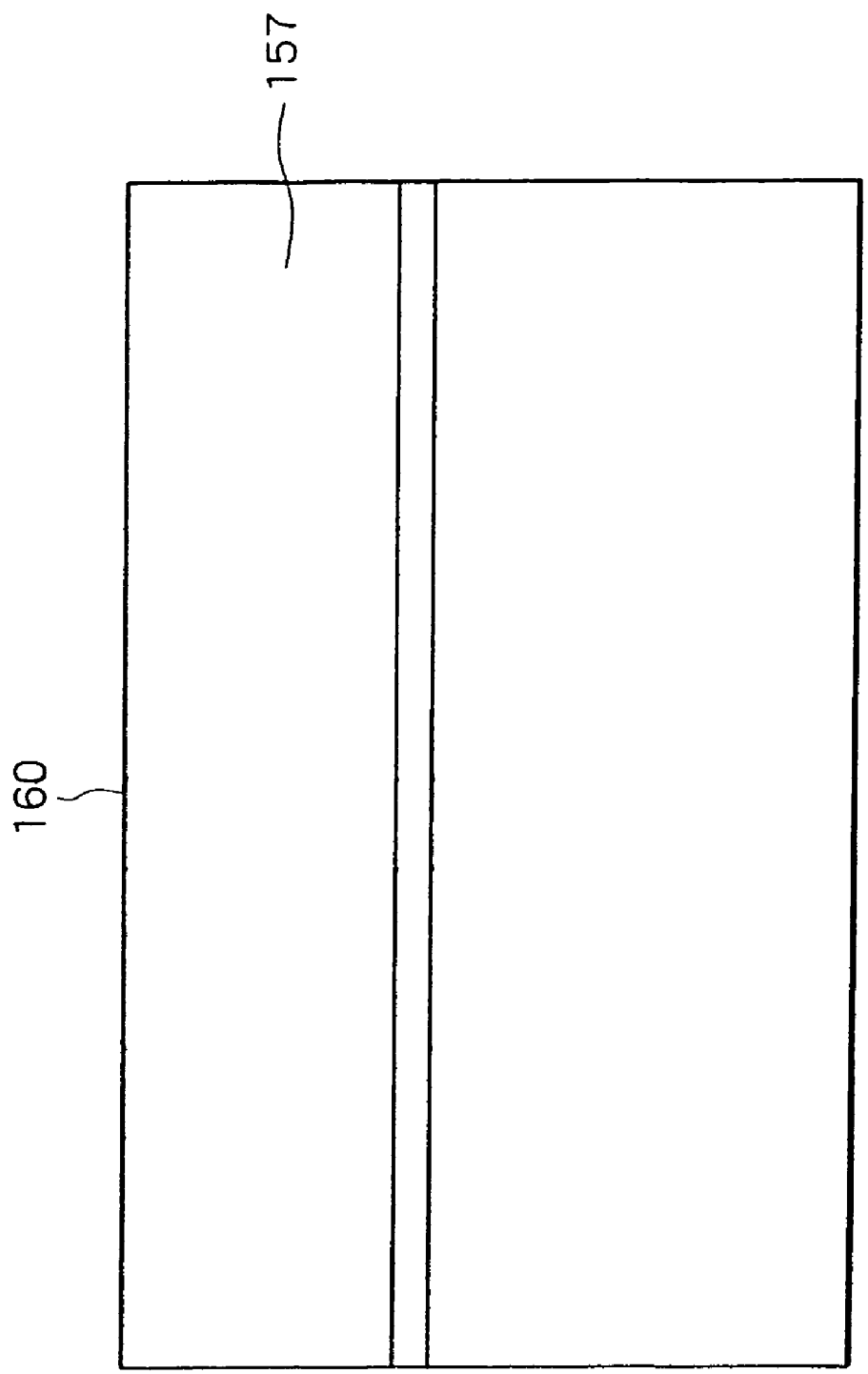
FIG. 19 is a sectional view showing a portion of the semiconductor laser device shown in FIGS. 18A and 18B, illustrating the method of fabricating a semiconductor laser device according to the tenth embodiment.

A method of fabricating a semiconductor laser according to this embodiment will be described with reference to FIGS. 16A to FIG. 19. FIGS. 16A and 16B are a plan view and a sectional view showing a device state at the time of formation of a p-type electrode and an n-type electrode, respectively. FIG. 17 is a side view of a portion of the semiconductor laser device, showing one of tilt planes of semiconductor layers and the p-type electrode formed thereon. FIGS. 18A and 18B are a plan view and a sectional view showing a device state after cleavage, respectively. FIG. 19 is a side view of a portion of the semiconductor laser device, showing the semiconductor layers and the p-type electrode formed thereon after cleavage.

As shown in FIGS. 16A and 16B, a base body 151 formed by stacking a lower growth layer on a sapphire substrate is prepared, and a selection mask 152 made from silicon oxide is formed on the base body 151. A stripe-shaped opening portion 153 extending with its longitudinal direction taken as a direction "q" in FIG. 16A is formed in the selection mask 152. A silicon-doped GaN layer 154 as a semiconductor layer, part of which functions as a first conductive type cladding layer, is formed by selective growth from the opening portion 153, an InGaN layer 155 functioning as an active layer is formed on the silicon-doped GaN layer 154, and a magnesium-doped GaN layer 156 functioning as a second conductive type cladding layer is formed on the InGaN layer 155. The silicon-doped GaN layer 154 is formed by selective growth such that a ridge line extends in the (1-100) direction or the (11-20) direction. A tilt plane 161 is formed on each of both sides of the ridge line. The tilt plane 161 is the (1-101) plane (S-plane) or (11-22) plane stably formed at the time of selective growth.

A p-type electrode 157 is formed on the magnesium-doped GaN layer 156 as the second conductive type cladding layer. The p-type electrode 157 is typically an electrode layer having a stacked structure of Ni/Pt/Au or Ni(Pd)/Pt/Au or the like. An n-type electrode 158 is made from Au or the like and is formed in an opening portion formed in the selection mask 152. The n-type electrode 158 is electrically connected to via the base body 151 to the silicon-doped GaN layer 154 as the first conductive type cladding layer. End portions of the p-type electrode 157 extending in the direction perpendicular to the ridge line are taken as approximately linear portions extending in the direction perpendicular to the direction "q" for easy cleavage.

After the p-type electrode 157 and the n-type electrode 158 are formed, as shown in FIGS. 18A and 18B and FIG. 19, the device is subjected to cleavage, to form two cleavage planes 170 extending in the direction perpendicular to the direction "q" of the structure. The pair of cleavage planes 170 function as resonance planes, to obtain a semiconductor laser device.

Eleventh Embodiment

Figure 20:
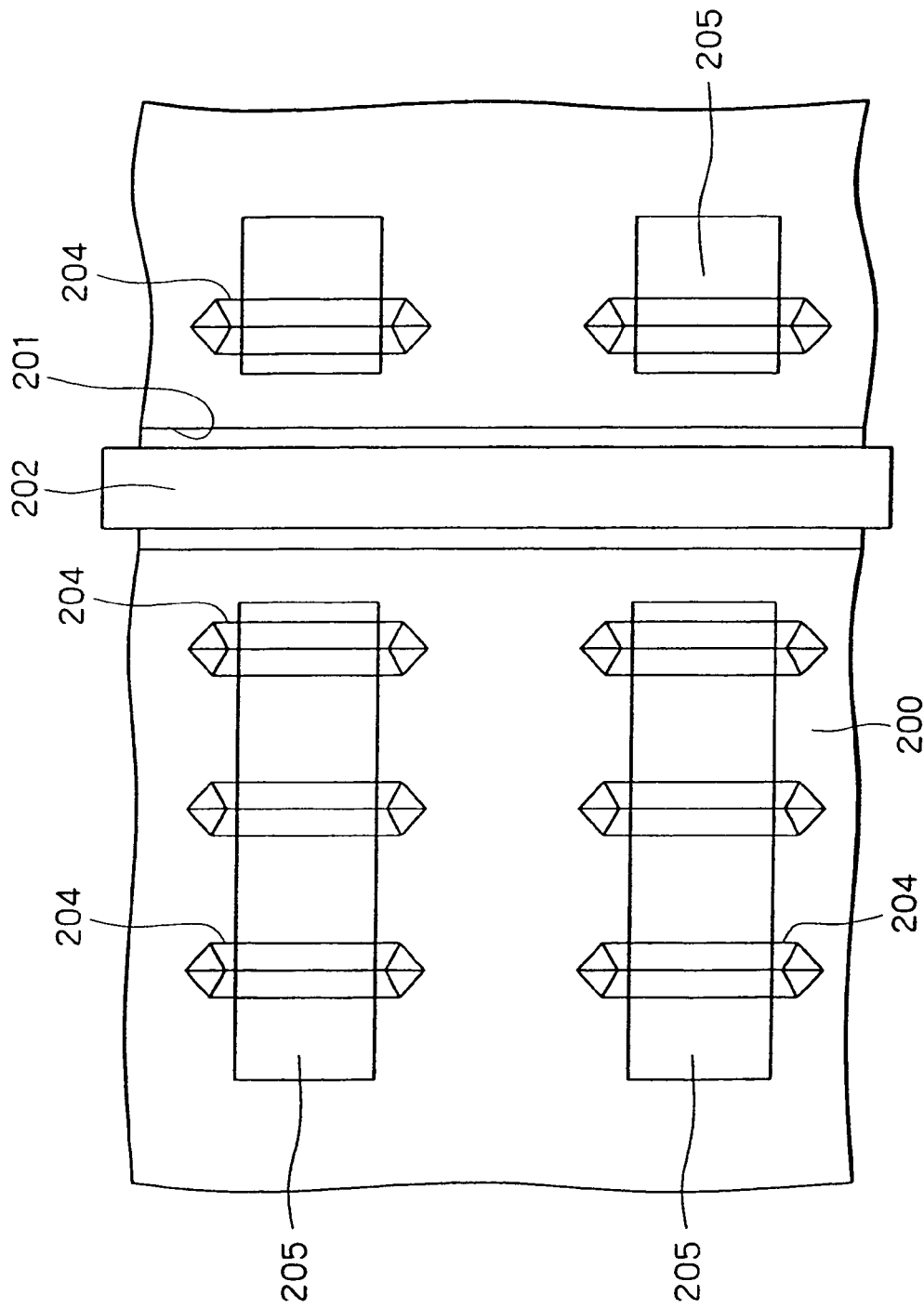
FIG. 20 is a partial plan view of a display unit according to an eleventh embodiment of the present invention.

A display unit composed of an array of a number of semiconductor light emitting devices, which have a structure similar to that described in each of the previous embodiment, according to an eleventh embodiment of the present invention will be described with reference to FIG. 20. As shown in FIG. 20, the display unit according to this embodiment has a structure in which a number of semiconductor layers 204 are formed on a substrate 200 by selective growth. Each of the semiconductor layers 204 has a structure described in each of the previous embodiment, in which a silicon-doped GaN layer as a semiconductor layer, part of which functions as a first conductive type cladding layer, an InGaN layer functioning as an active layer, and a magnesium-doped GaN layer functioning as a second conductive type cladding layer are stacked by selective growth from a stripe-shaped opening portion extending with its longitudinal direction taken as the (1-100) direction or the (11-20) direction. A p-type electrode 205 having a stacked structure of, for example, Ni/Pt/Au or Ni(Pd)/Pt/Au or the like, which is common to a number of the semiconductor layers 204, is formed into a strip-shaped pattern extending in the horizontal direction, and an n-type electrode 202 is formed in an opening portion 201 formed on a selection mask on the substrate 200.

This display unit is used such that an image is displayed by light emission from each of the semiconductor layers 204. The display unit can be also used as an illumination unit. The number of semiconductor layers 204 may be independently driven, and may be used for emission of light of a single color or multi-colors.

According to the display unit having the above-described structure in this embodiment, since the semiconductor layers are grown by selective growth from the opening portion extending in the (1-100) direction or the (11-20) direction, it is possible to easily stabilize device characteristics, and hence to obtain a structure in which a light emission characteristic is independent from a variation between one and another of the devices. Also, since each of the p-type electrode 205 and the n-type electrode 202 can be made common to the number of semiconductor layers, it is possible to facilitate patterning of the electrode by lithography, and hence to simplify the steps of fabricating the display unit.

As described above, according to an embodiment of the semiconductor light emitting device of the present invention, the longitudinal direction of the opening portion of the selection mask is taken as the (1-100) direction or (11-20) direction or a direction tilted from the (1-100) direction or (11-20) direction by an angle ranging from about 0.2° to about 20°, regions in each of which irregular crystal steps are formed can be made significantly small, and a p-type electrode can be formed substantially only in regions, each having regular crystal steps, located on tilt planes. As a result, a current can be injected substantially only in the regions which have the regular crystal steps and therefore exhibit stable characteristics. Thus, it is possible to obtain a structure in which a light emission characteristic is independent of a variation between one and another of the devices, and hence to provide a semiconductor light emitting device that is excellent for repeatability of fabrication. Since a p-type electrode is not formed at steep end portions of crystal growth, it is possible to facilitate patterning of the p-type electrode by lithography.

According to an embodiment of the semiconductor light emitting device of the present invention, an electrode can be formed in a region excluding portions with undesirable crystallinity, and a semiconductor laser device can be suitably fabricated by using the (1-100) direction or the (11-20) direction for cleavage.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A display unit including an array of a plurality of semiconductor devices, each device comprising:
   a base body;
   a selection mask formed on the base body, the selection mask defining a stripe-shaped opening having long-sides;
   a semiconductor layer formed by selective growth from the opening such as to have a ridge line substantially parallel to the long-sides of the opening, wherein the semiconductor layer is a wurtzite type compound semiconductor layer, and each of a pair of crystal planes located on both the sides of the ridge line is one of a (1-101) plane and a (11-22) plane; and a first conductive type cladding layer, an active layer, and a second conductive type cladding layer formed on the semiconductor layer, wherein the second conductive type cladding layer is formed on the pair of crystal planes, and an electrode is formed in a region of the second conductive type cladding layer that excludes a portion near the ridge line and that is located on the pair of crystal planes, and which has regular crystal steps.

* * * * *